US012791803B2

(12) United States Patent
Chen et al.

(10) Patent No.: US 12,791,803 B2
(45) Date of Patent: Nov. 10, 2026

(54) INTEGRATED CIRCUIT DEVICE MANUFACTURING METHOD

(71) Applicant: TAIWAN SEMICONDUCTOR MANUFACTURING COMPANY, LTD., Hsinchu (TW)

(72) Inventors: Yu-Hao Chen, Hsinchu (TW); Hui Yu Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 186 days.

(21) Appl. No.: 18/771,687

(22) Filed: Jul. 12, 2024

(65) Prior Publication Data

US 2024/0361546 A1 Oct. 31, 2024

Related U.S. Application Data

(62) Division of application No. 17/366,783, filed on Jul. 2, 2021, now Pat. No. 12,085,769.

(60) Provisional application No. 63/178,793, filed on Apr. 23, 2021.

(51) Int. Cl.

| | |
|---|---|
| ***G02B 6/42*** | (2006.01) |
| ***H10P 72/70*** | (2026.01) |
| ***H10W 70/09*** | (2026.01) |
| ***H10W 70/685*** | (2026.01) |
| ***H10W 74/01*** | (2026.01) |
| *H10W 40/22* | (2026.01) |
| *H10W 40/25* | (2026.01) |
| *H10W 70/02* | (2026.01) |
| *H10W 70/652* | (2026.01) |

(52) U.S. Cl.

CPC ......... *G02B 6/4268* (2013.01); *G02B 6/4255* (2013.01); *H10P 72/74* (2026.01); *H10W 70/09* (2026.01); *H10W 70/685* (2026.01); *H10W 74/016* (2026.01); *H10W 74/019* (2026.01); *H10P 72/7436* (2026.01); *H10W 40/22* (2026.01); *H10W 40/253* (2026.01); *H10W 40/254* (2026.01); *H10W 40/258* (2026.01); *H10W 40/259* (2026.01); *H10W 70/02* (2026.01); *H10W 70/6528* (2026.01)

(58) Field of Classification Search

None

See application file for complete search history.

(56) References Cited

U.S. PATENT DOCUMENTS

| | | | |
|---|---|---|---|
| 10,162,139 | B1 | 12/2018 | Wang |
| 10,641,975 | B2 | 5/2020 | Rehnstrom |
| 10,775,561 | B2 | 9/2020 | Meister |
| 11,805,592 | B2 | 10/2023 | Deng |
| 2001/0050430 | A1 | 12/2001 | Vendier |

(Continued)

*Primary Examiner* — Jerry Rahll

(74) *Attorney, Agent, or Firm* — Hauptman Ham, LLP

(57) ABSTRACT

In a method, a stacked structure including an electronic integrated circuit (IC) and a photonic IC is bonded to a heat spreader releasably attached to a carrier. A first multilayer structure is sequentially deposited and patterned over the stacked structure to form, in the first multilayer structure, a first waveguide optically coupled to the photonic IC. A redistribution structure is sequentially deposited and patterned over the first multilayer structure, the redistribution structure electrically coupled to the photonic IC. The carrier is detached from the heat spreader.

20 Claims, 23 Drawing Sheets

(56) References Cited

U.S. PATENT DOCUMENTS

| | | | | |
|---|---|---|---|---|
| 2003/0223697 | A1 | 12/2003 | Simon | |
| 2004/0156576 | A1 | 8/2004 | Windover | |
| 2007/0104413 | A1 | 5/2007 | Hsu | |
| 2007/0297713 | A1 | 12/2007 | Lu | |
| 2008/0247703 | A1 | 10/2008 | Kodama | |
| 2010/0209041 | A1 | 8/2010 | Matsushima | |
| 2010/0215314 | A1 * | 8/2010 | Lau | G02B 6/43 385/47 |
| 2014/0270629 | A1 | 9/2014 | Dutt | |
| 2015/0003841 | A1 | 1/2015 | McLaren | |
| 2015/0179568 | A1 | 6/2015 | Chang | |
| 2017/0115458 | A1 | 4/2017 | Mekis | |
| 2021/0066269 | A1 | 3/2021 | Yang | |

* cited by examiner

INTEGRATED CIRCUIT DEVICE MANUFACTURING METHOD

PRIORITY CLAIM

The present application is a divisional application of U.S. application Ser. No. 17/366,783, filed Jul. 2, 2021, now U.S. Pat. No. 12,085,769, issued Sep. 10, 2024, which claims the priority of U.S. Provisional Application No. 63/178,793, filed on Apr. 23, 2021. The above-referenced applications and patent(s) are incorporated herein by reference in their entireties.

BACKGROUND

The semiconductor industry has experienced rapid growth due to ongoing improvements in integration density of a variety of components (e.g., photoelectric devices, electrical components, or the like). To accommodate the miniaturized scale of semiconductor devices, also referred to as integrated circuit (IC) devices, various technologies and applications are developed for wafer-level packaging, involving greater numbers of different components with different functions. Improvements in integration density permit more components to be integrated into a given area.

As such, fabrication of the semiconductor device involves many steps and operations on such a small and thin semiconductor device. Therefore, the manufacturing of the semiconductor device at a miniaturized scale becomes more complicated. Further, greater numbers of different components with different materials are involved, resulting in greater demands on thermal management and heat dissipation efficiency due to high power density of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
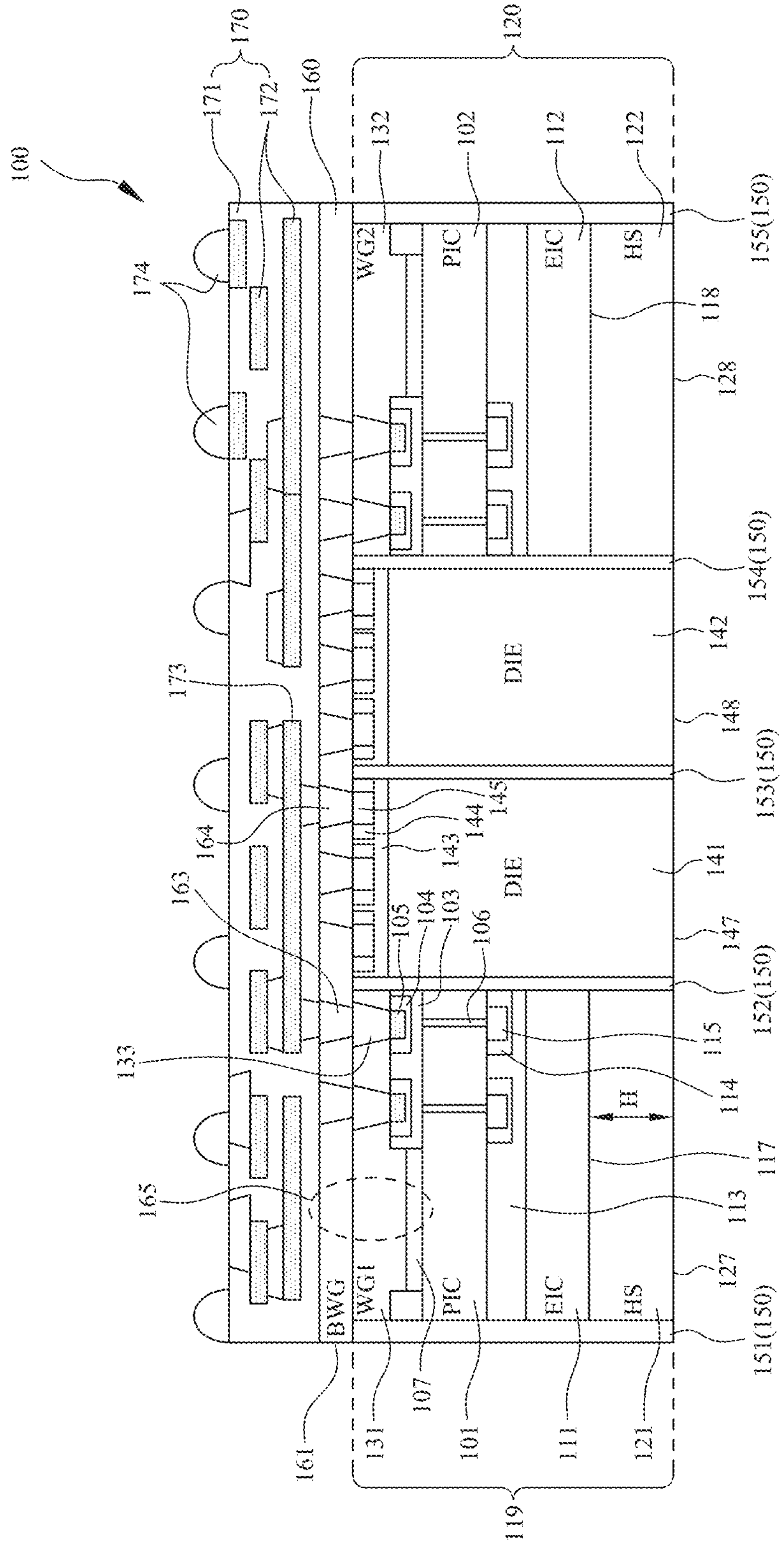
FIG. 1A is a schematic cross-sectional view of an IC device, in accordance with some embodiments.

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multiple dies (or chips) are often included in an IC device. For example, the dies comprise a photonic IC and an electronic IC for controlling the photonic IC. The photonic IC is sensitive to heat, especially heat dissipated from an adjacent heat source such as the electronic IC. In some embodiments, a heat spreader is included in the IC device for dissipating heat generated by the electronic IC away from the photonic IC. Various configurations are available for the heat spreader. For example, in at least one embodiment, the heat spreader is a transparent heat spreader. In one or more embodiments, the heat spreader is a metal heat spreader. In some embodiments, the heat spreader is an individual heat spreader supporting thereon the corresponding electronic IC and photonic IC. In at least one embodiment, the heat spreader is a common heat spreader supporting thereon multiple electronic ICs, multiple photonic ICs, and/or one or more further dies. In some embodiments, the IC device is a three-dimensional (3D) IC structure, an Integrated Fan-Out (InFO) structure, a system-on-wafer (SoW) structure, or the like. In at least one embodiment, a compacted system or package of a photonic IC and an electronic IC, with high performance and low form-factor, is provided, while issues related to heat generated by the electronic IC are obviated by the inclusion of one or more heat spreaders in the system or package.

FIG. 1A is a schematic cross-sectional view of an IC device 100, in accordance with some embodiments.

The IC device 100 comprises optical components 101, 102, electronic components 111, 112, heat spreaders 121, 122, multilayer structures 131, 132 having corresponding waveguides therein, dies 141, 142, a molding compound 150, a further multilayer structure 160 having a further waveguide therein, and a redistribution structure 170. The IC device 100 comprises a first stacked structure 119 in which the electronic component 111 is over the heat spreader 121, the optical component 101 is over the electronic component 111, and the multilayer structure 131 is over the optical component 101. The IC device 100 further comprises a second stacked structure 120 in which the electronic component 112 is over the heat spreader 122, the optical component 102 is over the electronic component 112, and the multilayer structure 132 is over the optical component 102. The dies 141, 142 are between the first and second stacked structures 119, 120. The molding compound 150 surrounds and embeds therein the dies 141, 142 and the first and second stacked structures 119, 120. The multilayer structure 160 is over the molding compound 150, the dies 141, 142, and the first and second stacked structures 119, 120. The redistribution structure 170 is over the multilayer structure 160. The configuration illustrated in FIG. 1A is an example. Other configurations are within the scopes of various embodiments. For example, the dies 141, 142, the second stacked structure 120 and one of the multilayer structures 131, 160 are omitted in at least one embodiment. For another example, the die 142 and the second stacked structure 120 are omitted in one or more embodiments. The optical component 101, electronic component 111, heat spreader 121, multilayer structure 131 and die 141 are correspondingly similar to the optical component 102, electronic component 112, heat spreader 122, multilayer structure 132 and die 142. Detailed descriptions of the optical component 102, electronic component 112, heat spreader 122, multilayer structure 132 and die 142 are omitted herein.

The optical component 101 is configured to perform one or more operations with respect to optical signals, such as, transmitting, receiving, modulating, phase shifting, converting to/from electrical signals, or the like. Optical components are also referred to hereinafter as "photonic ICs," and are schematically indicated in the drawings with a label "PIC." In some embodiments, the photonic IC 101 comprises at least one optical element including, but not limited to, an array of waveguides, one or more optical interfaces (or optical ports), one or more optical couplers, one or more light sources such as lasers, one or more light sensors, or the like. In the example configuration in FIG. 1A, the photonic IC 101 comprises a waveguide 107 and an optical coupler which are described in detail with respect to one or more of FIGS. 1B-1H.

In some embodiments, the photonic IC 101 further comprises at least one electronic element including, but not limited to, a laser driver, a control circuit, a transceiver circuit, a temperature sensor, or the like. The at least one electronic element in the photonic IC 101 comprises active devices. Examples of active devices include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

In example operations, the photonic IC 101 is configured to communicate by optical signals with an external optical fiber plugged into an optical port of the photonic IC 101, communicate by optical signals with another photonic IC, such as the photonic IC 102, through a waveguide in the multilayer structure 160, and/or communicate by electrical signals with the corresponding electronic component 111 and/or die 141. To electrically couple to the corresponding electronic component 111 and/or die 141, the photonic IC 101 comprises one or more conductors. For example, the photonic IC 101 comprises on a surface thereof (e.g., the upper surface in FIG. 1A) a conductive pad 105 and a through substrate via (TSV) 106 electrically coupled to the conductive pad 105. The conductive pad 105 is electrically coupled to the die 141, and the TSV 106 is electrically coupled to the electronic component 111, as described herein. In at least one embodiment, a diameter of the TSV 106 is about 2 μm. The conductive pad 105 is partially embedded in a first passivation layer 104, which is partially embedded in a second passivation layer 103. A purpose of the first passivation layer 104 and second passivation layer 103 is to avoid cracking during manufacture. In some embodiments, the first passivation layer 104 is softer than the second passivation layer 103. Example materials of the first passivation layer 104 and/or the second passivation layer 103 include, but are not limited to, $Si_3N_4$, $SiO_2$, a combination of $Si_3N_4$ and $SiO_2$, or the like. In at least one embodiment, one or more of the passivation layers 103, 104 is/are omitted.

The electronic component 111 is configured to control the photonic IC 101. Electronic components are also referred to hereinafter as "electronic ICs," and are schematically indicated in the drawings with a label "EIC." The electronic IC 111 comprises active devices as described herein. The active devices of the electronic IC 111 are electrically coupled to form one or more circuits for controlling the photonic IC 101. Example circuits of the electronic IC 111 include, but are not limited to, amplifiers, control circuits, laser driver circuits, digital processing circuits, or the like. The circuits of the electronic IC 111 are coupled to the photonic IC 101 to control the photonic IC 101 or to the die 141 to receive control signals from the die 141 through various conductors of the electronic IC 111. For example, the electronic IC 111 comprises on a surface thereof (e.g., the upper surface in FIG. 1A) a conductive pad 115 electrically coupled to the TSV 106 of photonic IC 101. The electronic IC 111 further comprises passivation layers 113, 114 corresponding passivation layers 103, 104 of photonic IC 101. In at least one embodiment, one or more of the passivation layers 113, 114 is/are omitted.

In some embodiments, the electronic IC 111 is configured solely to control the photonic IC 101. A reason is to reduce the number and/or complexity of circuits in the electronic IC 111, which, in turn, reduces or minimizes the amount of heat generated by the electronic IC 111 and transferable to the photonic IC 101. The photonic IC 101, as described herein, is heat sensitive. A reason is that the refractive index of one or more optical elements in the photonic IC 101, e.g., waveguides, varies with the temperature of the photonic IC 101. Because the electronic IC 111 is a heat source close to the photonic IC 101, it is a design consideration to reduce the amount of heat generated by the electronic IC 111 to ensure a stable or intended performance of the photonic IC 101.

The heat spreader 121 is bonded to a lower surface 117 of the electronic IC 111 to further reduce the amount of heat transferable from the electronic IC 111 to the photonic IC 101. Heat spreaders are schematically indicated in the drawings with a label "HS." In some embodiments, the heat spreader 121 comprises a material transparent to the light or wavelength of optical signals input to or output from the photonic IC 101. A reason, as described herein, is to make it possible to optically couple the photonic IC 101 to an external optical fiber from a side of the heat spreader 121. Example materials (with corresponding thermal conductivity) of a transparent heat spreader include, but are not limited to, Si or doped Si (149 W/(m·k)), GaN (130 W/(m·k)), diamond (2200 W/(m·k)), $Si_3N_4$ (10 W/(m·k)), $SiO_2$ (1.3 W/(m·k)), or the like. In some embodiments, the heat spreader 121 comprises a metal heat spreader. Although a metal heat spreader makes it difficult to optically couple the photonic IC 101 to an external optical fiber from a side of the heat spreader 121, compared to a transparent heat spreader, one or more further effects are achievable, e.g., higher thermal conductivity, higher mechanical strength, lower risk of warpage, or the like. Example materials (with corresponding thermal conductivity) of a metal heat spreader include, but are not limited to, Cu (385 W/(m·k)), Al (205 W/(m·k)), Au (314 W/(m·k)), Ag (406 W/(m·k)), or the like.

In some embodiments, various design considerations are contemplated to achieve a balance in thermal performance of the heat spreader 121. For example, a purpose of the heat spreaders 121, 122 is to dissipate the generated heat from the electronic ICs 111, 112 to the surrounding environment, such as air which is in direct contact with the corresponding lower surfaces 127, 128 of the heat spreaders 121, 122. From this point of view, the thinner a heat spreader is, the better. In some situations, a heat spreader has a further function, i.e., heat sink, which means that the heat spreader is configured to act as a thermal reservoir to keep some amount of heat therein, instead of passing the heat back to the electronic IC. From this point of view, the larger volume a heat spreader has, the better.

In one or more embodiments, in consideration of both of the described points of view, a thickness of a heat spreader is 50 μm~500 μm, whereas the area of the heat spreader is at least the same as the area of the electronic IC and/or die the heat spreader supports thereon. When the thickness of the heat spreader is less than 50 μm, there is a possibility that the volume of the heat spreader is insufficient and the heat sink performance of the heat spreader is limited. When the thickness of the heat spreader is greater than 500 μm, there is a possibility that the heat spreader becomes unnecessarily thick and large which increases manufacturing cost and/or time. A thickness H of the heat spreader 121 is indicated in FIG. 1A. In some embodiments, the heat spreader 122 has the same thickness H as the heat spreader 121. In at least one embodiment, the thickness of the heat spreader 122 is different from the thickness H of the heat spreader 121. In some embodiments, a heat spreader supports and/or is bonded to the entire lower surface(s) of the corresponding electronic IC and/or a further die. For example, in the example configuration in FIG. 1A, the heat spreader 121 supports and/or is bonded to the entire lower surface 117 of the electronic IC 111, and the heat spreader 122 supports and/or is bonded to the entire lower surface 118 of the electronic IC 112. In a further example configuration described with respect to FIG. 3A, a common heat spreader supports and/or is bonded to the entire lower surfaces of multiple electronic ICs and dies thereon.

In some embodiments, a further design consideration includes the manner in which a heat spreader is bonded to the corresponding electronic IC or die. In some embodiments, a heat spreader and the corresponding electronic IC of die are bonded in direct contact without a void in between, in a die bonding process. Example bonding techniques include, but are not limited to, direct surface bonding, metal-to-metal bonding, hybrid bonding, or the like. Other bonding techniques are within the scopes of various embodiments. In an example, direct surface bonding is performed between oxide layers on the surfaces to be bonded. Direct surface bonding is therefore also referred to as oxide-to-oxide bonding. An example direct surface bonding process comprises surface activation with a subsequent application of pressure and/or heat to join the surfaces. Metal-to-metal bonding comprises an application of pressure and/or heat to cause fusion of exposed and directly touching metal surfaces, such as conductive pads. Hybrid bonding comprises a combination of direct surface bonding and metal-to-metal bonding. In at least one embodiment, the heat spreaders 121, 122 are bonded by hybrid bonding to the corresponding electronic ICs 111, 112, and/or the electronic ICs 111, 112 are bonded by hybrid bonding to the corresponding photonic ICs 101, 102. In some embodiments, hybrid bonding, or another bonding technique with direct contact of the surfaces to be bonded, between the corresponding photonic IC and electronic IC promotes heat dissipation from the photonic IC to the electronic IC and then further to the surrounding environment through the corresponding heat spreader.

In some embodiments, an additional bonding material is disposed between and bonds facing surfaces of a heat spreader and a corresponding electronic IC or chip. Example bonding materials include, but are not limited to, a high-k polymer (e.g., a high-k DAF), a metal (e.g., In, Sn, or the like), a thermal interface material (TIM), solder paste, or the like.

The multilayer structure 131 is over the photonic IC 101 and comprises a waveguide optically coupled to the waveguide 107 of the photonic IC 101. The waveguide in the multilayer structure 131 is schematically indicated in the drawings with a label "WG1." The multilayer structure 132 is over the photonic IC 102 and comprises a waveguide optically coupled to a waveguide (not numbered) of the photonic IC 102. The waveguide in the multilayer structure 132 is schematically indicated in the drawings with a label "WG2." The multilayer structure 160 is over the multilayer structures 131, 132 and comprises a bridging waveguide. The bridging waveguide in the multilayer structure 160 is schematically indicated in the drawings with a label "BWG." The waveguide BWG has a first portion over and optically coupled to the waveguide WG1, as described with respect to FIG. 1B. The waveguide BWG has a second portion over and optically coupled to the waveguide WG2. In other words, the waveguides WG1, WG2 are optically coupled to each other by the waveguide BWG. The multilayer structure 160 comprises an optical port 161 configured for edge coupling of an external optical fiber to the waveguide BWG. Example configurations of the waveguides 107, WG1, BWG are described with respect to FIG. 1B which is an enlarged view of a region 165 in the IC device 100.

The die 141, 142 is configured to process data in electrical signals converted from the optical signals output from the corresponding photonic IC 101, 102, and/or to output data, in electrical signals, to the corresponding photonic IC 101, 102 for conversion to optical signals for further processing and/or transmission. In the example configuration in FIG. 1A, the die 141 is electrically coupled to the photonic IC 101, which is optically coupled to the photonic IC 102 through one or more of the waveguides 107, WG1, WG2, BWG, and the photonic IC 102 is electrically coupled to the die 142. As a result, the dies 141, 142 are coupled to each other through photonic ICs 101, 102 and the optical connection between the photonic ICs 101, 102. In some embodiments, such an optical connection permits data to be communicated between the dies 141, 142 at a higher speed and lower power consumption than when the dies 141, 142 are coupled by electrical connections without an optical connection. In some embodiments, the dies 141, 142 are coupled both by electrical connections through the redistribution structure 170 and by the optical connection between the photonic ICs 101, 102. In some embodiments, at least one of the dies 141, 142 communicate with an external device through the corresponding photonic IC 101, 102, the optical port 161 of the waveguide BWG, and/or other optical ports and optical couplers as described herein. Example configurations of the dies 141, 142 include, but are not limited to, memory chips, application-specific integrated circuits (ASICs), programmable processors or microprocessors, digital signal processors (DSPs), or the like. In an example, the die 141 is a memory chip and the die 142 is an ASIC or programmable processor. In the example configuration in FIG. 1A, lower surfaces 147, 148 of the dies 141, 142 are exposed to the environment.

To electrically couple to the corresponding photonic IC 101, 102 and/or electronic IC 111, 112, the die 141, 142 comprises one or more conductors. For example, the die 141 comprises on a surface thereof (e.g., the upper surface in FIG. 1A) a conductive pad 145, and passivation layers 143, 144 corresponding passivation layers 103, 104 of photonic IC 101. In at least one embodiment, one or more of the passivation layers 143, 144 is/are omitted. A plurality of conductors is formed in the multilayer structures 131, 132, 160 to electrically couple the photonic ICs 101, 102 and the corresponding dies 141, 142 to each other through the redistribution structure 170. For example, the multilayer structure 131 comprises therein a via structure 133 electrically coupled to the conductive pad 105. The multilayer structure 160 comprises therein a via structure 163 electrically coupled to the via structure 133, and a via structure 164 electrically coupled to the conductive pad 145 of the die 141. The via structures 163, 164 are electrically coupled together by a conductor 173 in the redistribution structure 170. As a result, the die 141 is electrically coupled to the photonic IC 101, and/or is electrically coupled to the electronic IC 111 through one or more TSVs 106 in the photonic IC 101.

The redistribution structure 170 comprises a plurality of dielectric layers commonly designated with the reference numeral 171, and a plurality of conductors 172, 173. A plurality of solder bumps 174 are formed over the redistribution structure 170 and electrically coupled to various ICs and dies in the IC device 100 through the conductors 172, 173 of the redistribution structure 170. The solder bumps 174 are configured to physically mount and electrically couple the IC device 100 to another device, e.g., a motherboard. The described solder bumps 174 are an example. Other configurations for physically mounting and electrically coupling the IC device 100 to another device are within the scopes of various embodiments.

The molding compound 150 extends around the first stacked structure 119, second stacked structure 120, and dies 141, 142. The molding compound 150 comprises various molding compound portions 151-155. Although in the cross-section of FIG. 1A, the molding compound portions 151-155 are separated from each other, in at least one embodiment, the molding compound portions 151-155 are contiguous to each other and form a single integrated body of the molding compound 150. The molding compound portions 151 and 155 define an outermost part of the molding compound 150 and also define the outermost, peripheral surface of the IC device 100. The molding compound portion 152 is between the first stacked structure 119 and the die 141, the molding compound portion 153 is between the dies 141, 142, and the molding compound portion 154 is between the second stacked structure 120 and the die 142. In some embodiments, the molding compound 150 comprises a thermally isolating material. As a result, a transfer of the heat generated by the die 141, 142 to the adjacent, heat-sensitive photonic IC 101, 102 is limited by the molding compound portion 152, 154, which is thermally isolating, between the die 141, 142 and the corresponding photonic IC 101, 102. Example materials of the molding compound 150 include, but are not limited to, an epoxy resin, a molding underfill, or the like. In some embodiments, the IC device 100 is a final and completed IC package which requires no further packaging process or operation.

Figure 1B:
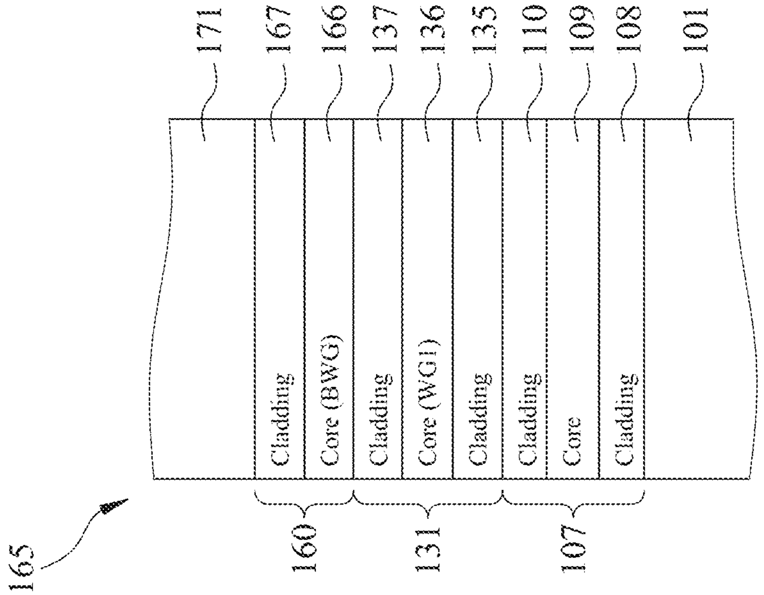
FIG. 1B is an enlarged schematic cross-sectional view of a region of an IC device, in accordance with some embodiments.

FIG. 1B is an enlarged schematic cross-sectional view of a region 165 of the IC device 100, in accordance with some embodiments. The region 165 includes various layers of the waveguide 107, the waveguide WG1 in the multilayer structure 131, and the waveguide BWG in the multilayer structure 160.

The waveguide 107 over the photonic IC 101 comprises a multilayer structure having a cladding layer 108 over the photonic IC 101, a core layer 109 over the cladding layer 108, and a further cladding layer 110 over the core layer 109. In other words, the core layer 109 is sandwiched between the cladding layers 108, 110. In regions where the core layer 109 is not formed, the cladding layers 108, 110 contact each other, or a cladding layer having substantially the same refractive index as the cladding layers 108, 110 is between and connects the cladding layers 108, 110. Electrical connections such as via structures, TSVs, conductive pads are formed through the multilayer structure of the waveguide 107 in the regions where the core layer 109 is not formed, so as to avoid disrupting optical signal paths through the core layer 109. To form a waveguide, a refractive index of a core layer is higher than that of cladding layers between which the core layer is sandwiched. In at least one embodiment, the refractive index of the core layer is at least 0.01 higher than the refractive index of the cladding layers. An example material of the cladding layers 108, 110 is $SiO_2$. An example material of the core layer 109 is Si. Other materials for the cladding layer and/or the core layer are within the scopes of various embodiments. In one or more embodiments, the material of the cladding layer 108 is different from that of the cladding layer 110. In some embodiments, the cladding layer 108 is a buried oxide layer (e.g., $SiO_2$) and the core layer 109 is a Si layer in a silicon-on-insulator (SOI) substrate. In some embodiments, the photonic IC 101 comprises a Si substrate or a substrate of a material that is transparent to the light or wavelength of optical signals input to or output from the photonic IC 101. In at least one embodiment, one or more optical couplers are formed in or over the waveguide 107, as described herein.

The multilayer structure 131 comprises a cladding layer 135 over the cladding layer 110, a core layer 136 over the cladding layer 135, and a further cladding layer 137 over the core layer 136. In other words, the core layer 136 is sandwiched between the cladding layers 135, 137. The core layer 136 defines the waveguide WG1. In regions where the core layer 136 is not formed, the cladding layers 135, 137 contact each other, or a cladding layer having substantially the same refractive index as the cladding layers 135, 137 is between and connects the cladding layers 135, 137. Electrical connections such as via structures, TSVs, conductive pads are formed through the multilayer structure 131 in the regions where the core layer 136 is not formed, so as to avoid disrupting optical signal paths through the core layer 136 or waveguide WG1. In some embodiments, the refractive index of each of the core layer 136 and the cladding layers 135, 137 is from 1 to 2. In at least one embodiment, the refractive index of the core layer 136 is at least 0.01 higher than the refractive index of the cladding layers 135, 137. In one or more embodiments, the core layer 136 and cladding layers 135, 137 comprise polymer materials, and the waveguide WG1 is referred to as a polymer waveguide. Example materials of the cladding layers 135, 137 include, but are not limited to, polyimide (PI), benzocyclobutene (BCB), polybenzoxazole (PBO), a fluorinated polymer, polynorbornene, silicone, siloxane acrylates, epoxy nano-filled phenol resin, or the like. Other materials, including non-polymer materials, for the cladding layers 135, 137 are within the scopes of various embodiments. Example materials of the core layer 136 include, but are not limited to, a high-K polymer such as PBO and/or PI. Other materials, including non-polymer materials, for the core layer 136 are within the scopes of various embodiments. In one or more embodiments, the material of the cladding layer 135 is different from that of the cladding layer 137. The waveguide WG1 is optically coupled to the waveguide 107 by one or more optical couplers as described herein, for example, with respect to FIGS. 1F-1H.

The multilayer structure 160 comprises a core layer 166 over the cladding layer 137 of the underlying multilayer structure 131, and a further cladding layer 167 over the core layer 166. In other words, the core layer 166 is sandwiched between the cladding layers 137, 167. The core layer 166 defines the waveguide BWG. In regions where the core layer 166 is not formed, the cladding layers 137, 167 contact each other, or a cladding layer having substantially the same refractive index as the cladding layers 137, 167 is between and connects the cladding layers 137, 167. Electrical connections such as via structures, TSVs, conductive pads are formed through the multilayer structure 160 in the regions where the core layer 166 is not formed, so as to avoid disrupting optical signal paths through the core layer 166 or waveguide BWG. In the example configuration in FIG. 1B, the waveguide BWG and the waveguide WG1 share the same cladding layer 137. Other configurations, such as separate cladding layers of the waveguide BWG and waveguide WG1, are within the scopes of various embodiments. In the example configuration in FIG. 1B, the cladding layer 167 is a layer separate from the dielectric layer 171 of the redistribution structure 170. Other configurations, e.g., where the cladding layer 167 is a part of the dielectric layer 171, are within the scopes of various embodiments. In at least one embodiment, the dielectric layer 171 comprises the same polymer material as the cladding layers 135, 137, 167.

In some embodiments, the refractive index of each of the core layer 166 and the cladding layers 137, 167 is from 1 to 2. In at least one embodiment, the refractive index of the core layer 166 is at least 0.01 higher than the refractive index of the cladding layers 137, 167. In one or more embodiments, the core layer 166 and cladding layers 137, 167 comprise polymer materials, and the waveguide BWG is referred to as a polymer waveguide. Example materials of the cladding layers 137, 167 include, but are not limited to, PI, BCB, PBO, a fluorinated polymer, polynorbornene, silicone, siloxane acrylates, epoxy nano-filled phenol resin, or the like. Other materials, including non-polymer materials, for the cladding layers 137, 167 are within the scopes of various embodiments. Example materials of the core layer 166 include, but are not limited to, a high-K polymer such as PBO and/or PI. Other materials, including non-polymer materials, for the core layer 166 are within the scopes of various embodiments. In one or more embodiments, the material of the cladding layer 167 is different from that of the cladding layer 137. The waveguide BWG is optically coupled to the waveguide WG1 by one or more optical couplers as described herein, for example, with respect to FIGS. 1F-1H. By a sequential optical connection from the waveguide 107 to the waveguide WG1 and then to the waveguide BWG, it is possible to communicate optical signals between the photonic IC 101 and the waveguide BWG, for further optical signal communication to another component, such as the photonic IC 102.

Various optical coupler configurations to, from, or between waveguides are described with respect to FIGS. 1C-1H.

Figure 1C:
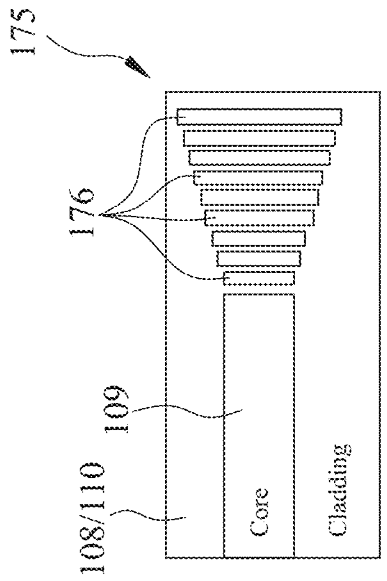
FIGS. 1C-1H are schematic views of various optical couplers in one or more IC devices, in accordance with some embodiments.
Figure 1D:
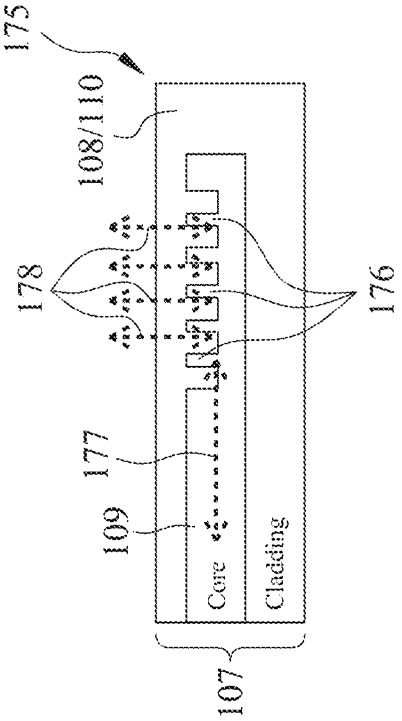

FIG. 1C is a schematic top view of an optical coupler 175 in an IC device, and FIG. 1D is a schematic cross-sectional view of the optical coupler 175, in accordance with some embodiments. The optical coupler 175 is a grating-coupler. In at least one embodiment, the optical coupler 175 is formed in one or more of the waveguides 107, WG1, BWG to communicate with another overlying or underlying waveguide, and/or to communicate with an external optical fiber in a thickness direction of the IC device.

In the example configuration in FIGS. 1C-ID, the optical coupler 175 is formed in the waveguide 107. In the schematic top view in FIG. 1C, the optical coupler 175 comprises a plurality of gratings 176 in the core layer 109. The gratings 176 have the same material as the core layer 109, have gradually increasing widths and are spaced from each other by segments of the cladding layers 108, 110. In the schematic cross-sectional view in FIG. 1D, when light 177 transmitted along the core layer 109 and carrying optical signals is incident on the gratings 176, the gratings 176 reflect or redirect light 177 upwardly as light 178. In a reserved signal propagation direction, when light 178 carrying optical signals is incident from above upon the gratings 176, the gratings 176 reflect or redirect light 178 laterally as light 177.

Figure 1E:
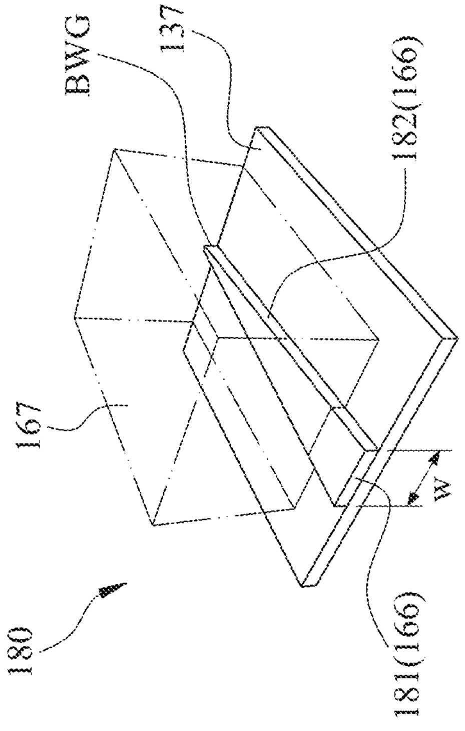

FIG. 1E is a schematic perspective view of an optical coupler 180 in an IC device, in accordance with some embodiments. The optical coupler 180 is an edge coupler. In at least one embodiment, the optical coupler 180 is formed at an edge of one or more of the waveguides 107, WG1, BWG provided that the edge of the core layer of the waveguide is exposable to light carrying optical signals.

In the example configuration in FIG. 1E, the optical coupler 180 corresponds to the optical port 161 and is formed at an edge of the waveguide BWG that is exposed along a peripheral side surface of the IC device 100. The optical coupler 180 comprises contiguous portions 181, 182 of the core layer 166. The portion 181 is exposed from the cladding layer 167. The portion 181 comprises an exposed edge of the waveguide BWG and has a width w at the exposed edge. The portion 182 has a width gradually decreasing from the width w of the portion 181, as the portion 182 extends continuously from the portion 181 inwardly of the IC device, until the width of the portion 182 becomes equal to a width of the waveguide BWG. In some embodiments, the optical coupler 180 is formed integrally and simultaneously with the waveguide BWG, as the optical coupler 180 and the waveguide BWG comprise the same, continuous material of the core layer 166. Light carrying optical signals incident on the portion 181 is transmitted inside the IC device to the waveguide BWG.

Figure 1G:
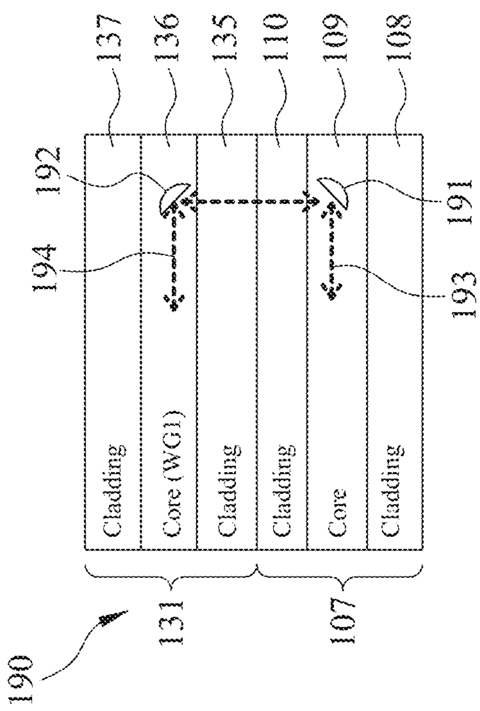
Figure 1F:
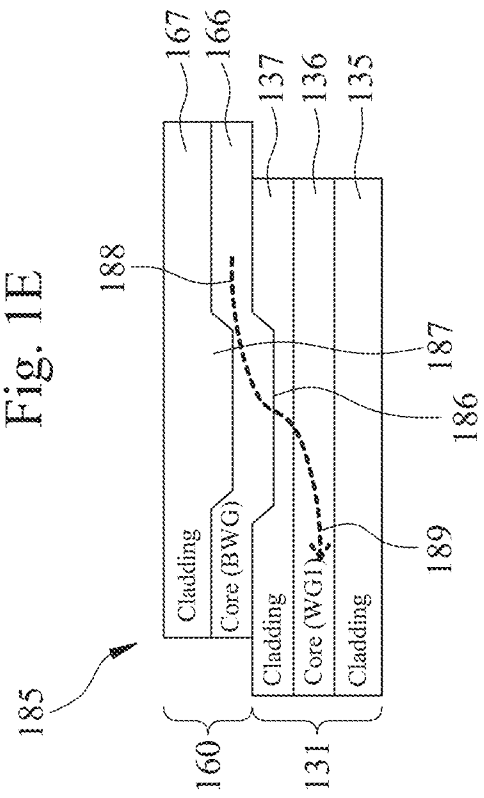

FIG. 1F is a schematic cross-sectional view of an optical coupler 185 in an IC device, in accordance with some embodiments. In at least one embodiment, the optical coupler 185 is formed in one or more of the waveguides 107, WG1, BWG to optically couple the waveguide with an adjacent overlying or underlying waveguide in a thickness direction of the IC device.

In the example configuration in FIG. 1F, the optical coupler 185 is formed in the waveguide BWG, and comprises a projecting portion 186 of the core layer 166, and a projecting portion 187 of the cladding layer 167. The projecting portion 186 of the core layer 166 protrudes from above, in the thickness direction of the IC device, into the underlying cladding layer 137. The projecting portion 187 of the cladding layer 167 has a shape corresponding to a shape of the projecting portion 186 of the core layer 166, and protrudes from above, in the thickness direction of the IC device, into the core layer 166. Due to the protruding shapes of the projecting portions 186, 187 and/or differences in the refractive index among the adjacent layers of the waveguides WG1, BWG, light 188 carrying optical signals in the waveguide BWG and incident upon the optical coupler 185 from the right side in FIG. 1F is redirected as light 189 into the underlying waveguide WG1 and further propagates to the left side in FIG. 1F. Although not illustrated, light carrying optical signals in the waveguide BWG and incident upon the optical coupler 185 from the left side in FIG. 1F is redirected into the underlying waveguide WG1 to further propagate to the right side in FIG. 1F.

FIG. 1G is a schematic cross-sectional view of an optical coupler 190 in an IC device, in accordance with some embodiments. In at least one embodiment, the optical coupler 190 is formed in a pair of waveguides 107, WG1, BWG to optically couple the pair of waveguides in a thickness direction of the IC device.

In the example configuration in FIG. 1G, the optical coupler 190 is formed in the waveguides 107, WG1, and comprises a reflective structure 191 in the core layer 109 of the waveguide 107 and a corresponding reflective structure 192 in the core layer 136 of the waveguide WG1. The reflective structure 191 is configured to reflect light 193 carrying optical signals in the waveguide 107 upwardly to the reflective structure 192 which is configured to further reflect the light into the waveguide WG1 as light 194, and vice versa. The illustrated parallel directions of the light 193, 194 are examples. Other light propagating and/or light reflecting directions are within the scopes of various embodiments. In at least one embodiment, the reflective structure 191 comprises a grating coupler as described with respect to the optical coupler 175, and the reflective structure 192 comprises another grating coupler which has a reversed, or upside-down configuration of the optical coupler 175. Other reflective structure configurations are within the scopes of various embodiments.

Figure 1H:
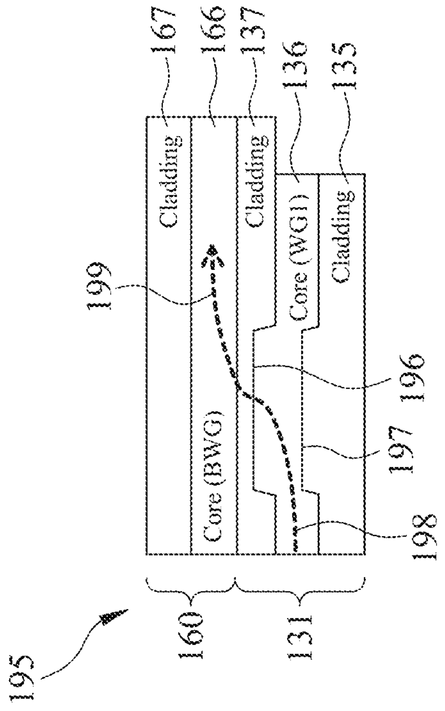

FIG. 1H is a schematic cross-sectional view of an optical coupler 195 in an IC device, in accordance with some embodiments. The optical coupler 195 is a reversed configuration of the optical coupler 185. In at least one embodiment, the optical coupler 195 is formed in one or more of the waveguides 107, WG1, BWG to optically couple the waveguide with an adjacent overlying or underlying waveguide in a thickness direction of the IC device.

In the example configuration in FIG. 1H, the optical coupler 195 is formed in the waveguide WG1, and comprises a projecting portion 196 of the core layer 136, and a projecting portion 197 of the cladding layer 135. The projecting portion 196 of the core layer 136 protrudes from below, in the thickness direction of the IC device, into the overlying cladding layer 137. The projecting portion 197 of the cladding layer 135 has a shape corresponding to a shape of the projecting portion 196 of the core layer 136, and protrudes from below, in the thickness direction of the IC device, into the core layer 136. Due to the protruding shapes of the projecting portions 196, 197 and/or differences in the refractive index among the adjacent layers of the waveguides WG1, BWG, light 198 carrying optical signals in the waveguide WG1 and incident upon the optical coupler 195 from the left side in FIG. 1H is redirected as light 199 into the overlying waveguide BWG and further propagates to the right side in FIG. 1H. Although not illustrated, light carrying optical signals in the waveguide WG1 and incident upon the optical coupler 195 from the right side in FIG. 1H is redirected into the overlying waveguide BWG to further propagate to the left side in FIG. 1H.

In some embodiments, one or more of optical couplers 175, 180 described with respect to FIGS. 1C-1E permit optical coupling of one or more waveguides in an IC device to an external optical component, e.g., an external optical fiber, whereas one or more of optical couplers 185, 190, 195 described with respect to FIGS. 1F-1H permit optical coupling of between waveguides at different levels in the IC device.

Figure 2A:
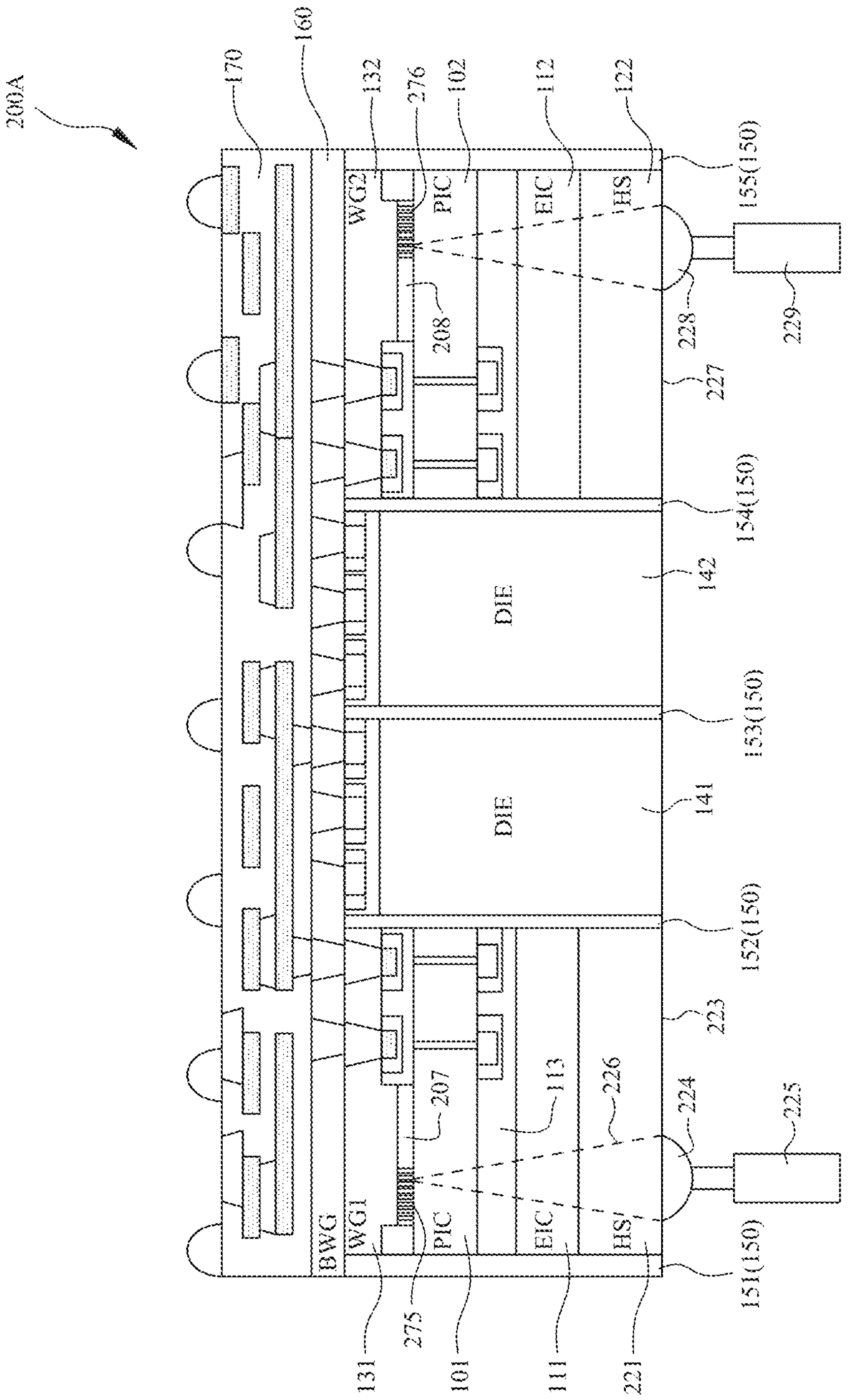
FIGS. 2A-2C are schematic cross-sectional views of one or more IC devices in optical connection with one or more optical fibers, in accordance with some embodiments.
Figure 2B:
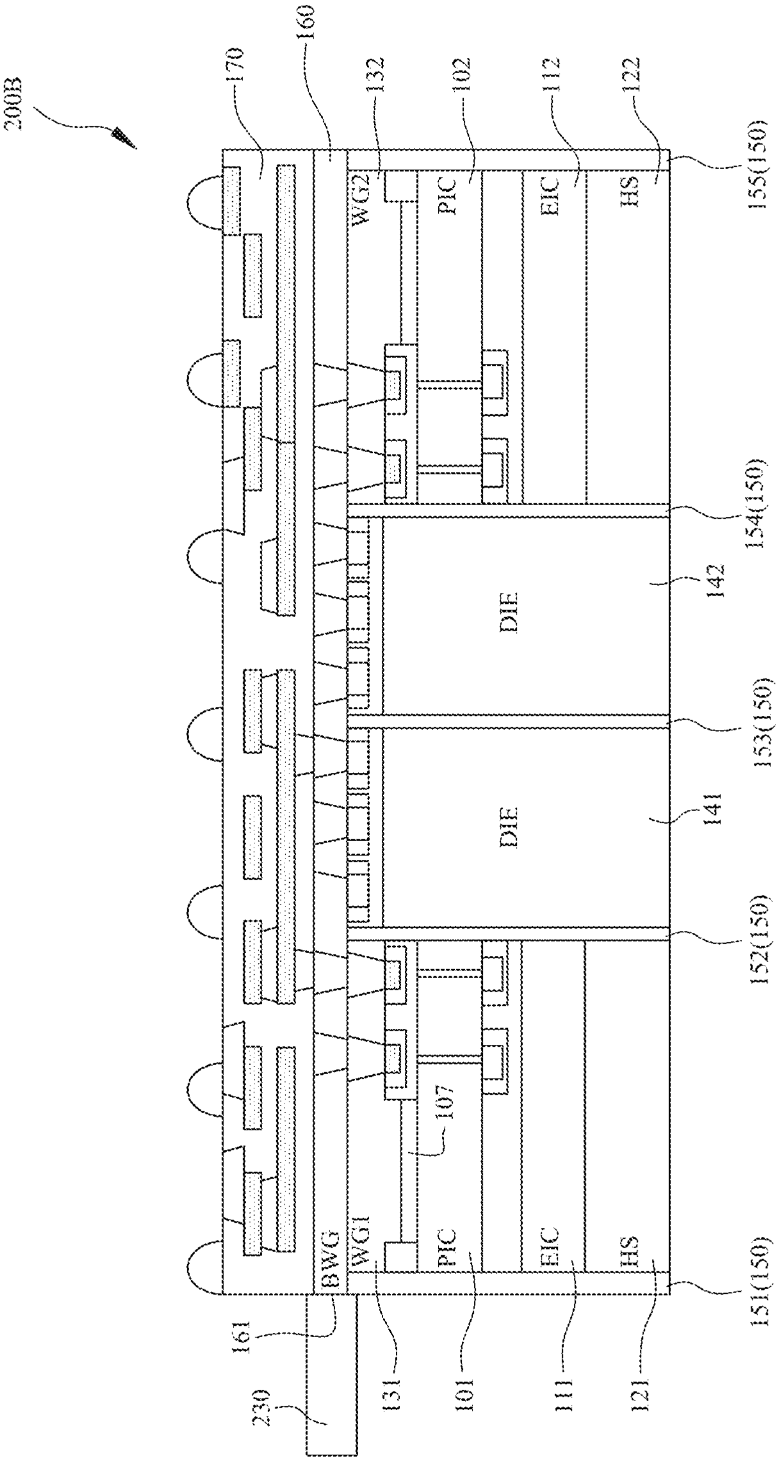
Figure 2C:
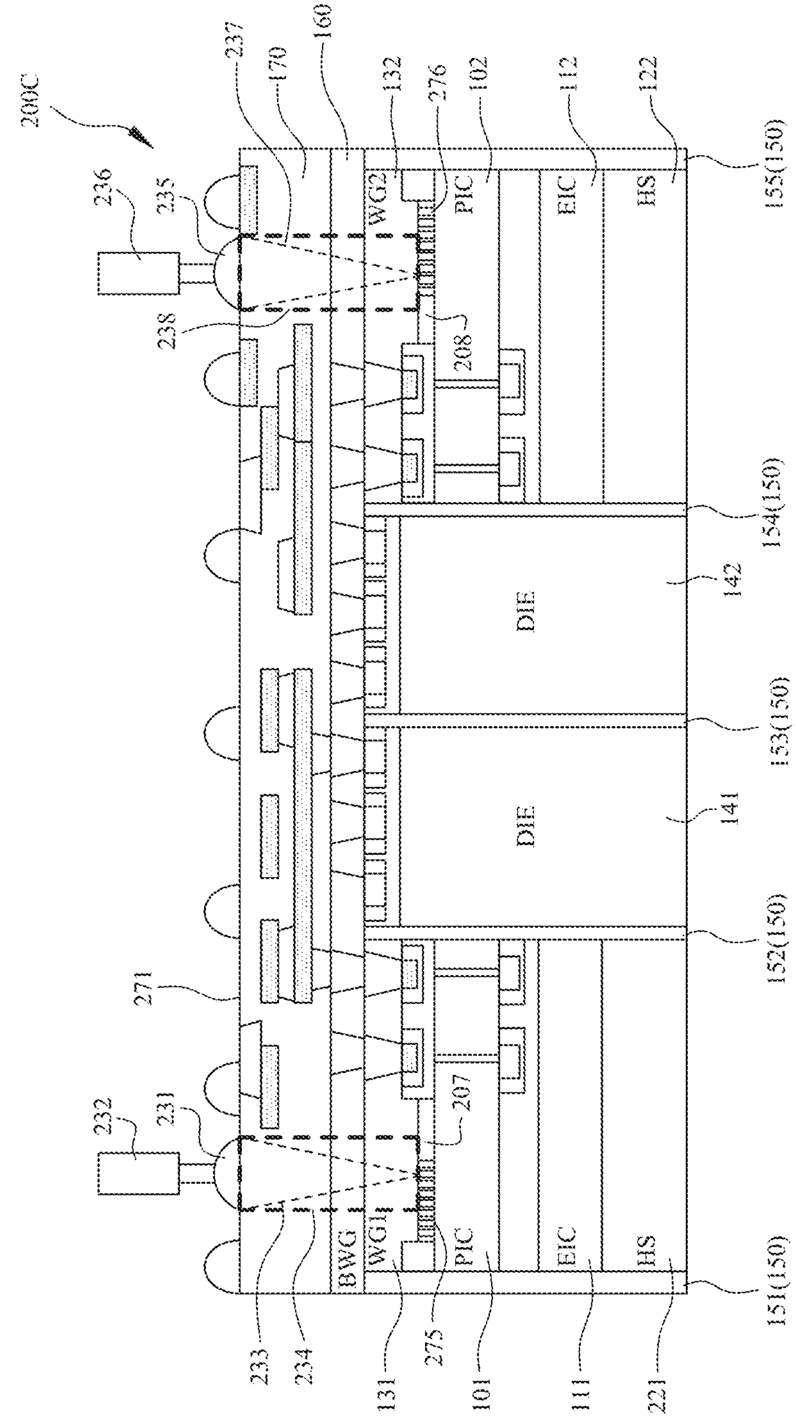

FIGS. 2A-2C are schematic cross-sectional views of IC devices 200A-200C, in accordance with some embodiments. The IC devices 200A-200C comprise optical ports for optical coupling to external optical fibers in various manners. The IC device 200A in FIG. 2A comprises at least one optical port for optical coupling from a side of a transparent heat spreader. The IC device 200B in FIG. 2B comprises at least one optical port for edge coupling. The IC device 200C in FIG. 2C comprises at least one optical port for optical coupling from a side of a redistribution structure. In some embodiments, an IC device comprises a combination of various optical ports described with respect to FIGS. 2A-2C. Corresponding elements of the IC devices 100, 200A-200C are designated by the same reference numerals.

In FIG. 2A, the IC device 200A comprises transparent heat spreaders 221, 222 corresponding to the heat spreaders 121, 122. The transparent heat spreaders 221, 222 permit the IC device 200A to be optically coupled to one or more external optical fibers from the side of the heat spreaders 221, 222. For example, a lower surface 223 of the heat spreader 221 has a lens 224 attached thereto. In at least one embodiment, the lens 224 defines an optical port for optically coupling an external optical fiber 225 to the IC device 200A. The lens 224 is configured to focus or direct light 226 output from the external optical fiber 225 onto an optical coupler 275 in a waveguide 207 of the photonic IC 101. In at least one embodiment, the waveguide 207 corresponds to the waveguide 107 described with respect to FIG. 1A, and the optical coupler 275 is a grating coupler corresponding to the optical coupler 175 described with respect to FIGS. 1B-IC. The light 226 passes through the transparent heat spreader 221, the electronic IC 111, the passivation layer 113, and the photonic IC 101 before being incident upon the optical coupler 275. Materials of the electronic IC 111, the passivation layer 113, and the photonic IC 101 are transparent to the light 226. For example, each of the electronic IC 111 and photonic IC 101 comprises a Si substrate. The light 226 incident upon the optical coupler 275 is directed by the optical coupler 275 into the waveguide 207 for further processing by the photonic IC 101, and/or for further transmission to the waveguides WG1, BWG. Similarly, a lower surface 227 of the heat spreader 222 has a lens 228 attached thereto. In at least one embodiment, the lens 228 defines an optical port for optically coupling an external optical fiber 229 to the IC device 200A. The lens 228 is configured to focus or direct light output from the external optical fiber 229 onto an optical coupler 276 in a waveguide 208 of the photonic IC 102. Example materials of the lens 224, 228 include, but are not limited to, a polymer, Si, or the like. In some embodiments, one or both the lens 224, 228 on the side of the heat spreaders 221, 222 is/are omitted.

In FIG. 2B, the IC device 200B is configured to be optically coupled to an external optical fiber 230 through an optical port 161 for edge coupling to the waveguide BWG. In some embodiments, the optical port 161 for edge coupling corresponds to the optical coupler 180 described with respect to FIG. 1E. In at least one embodiment, the optical edge coupling described with respect to FIG. 2B is applicable to both IC devices having transparent heat spreaders and IC devices having metal heat spreaders.

In FIG. 2C, the IC device 200C is configured to be optically coupled to an external optical fiber from a side of the redistribution structure 170. For example, an upper surface 271 of the redistribution structure 170 has a lens 231 attached thereto over a region corresponding to the photonic IC 101. In at least one embodiment, the lens 231 defines an optical port for optically coupling an external optical fiber 232 to the IC device 200C. The lens 231 is configured to focus or direct light 233 output from the external optical fiber 232 onto the optical coupler 275 in the waveguide 207 of the photonic IC 101. In some embodiments, the light 233 passes through a region 234 of the redistribution structure 170 and multilayer structures 160, 131 in which no conductive features, such as conductive patterns, via structures, conductive pads, or the like, are formed to avoid impeding transmission of optical signals. Similarly, the upper surface 271 of the redistribution structure 170 has a lens 235 attached thereto over a region corresponding to the photonic IC 102. In at least one embodiment, the lens 235 defines an optical port for optically coupling an external optical fiber 236 to the IC device 200C. The lens 235 is configured to focus or direct light 237 output from the external optical fiber 236 onto the optical coupler 276 in the waveguide 208 of the photonic IC 102. In some embodiments, the light 237 passes through a region 238 of the redistribution structure 170 and multilayer structures 160, 132 in which no conductive features, such as conductive patterns, via structures, conductive pads, or the like, are formed to avoid impeding transmission of optical signals. In some embodiments, one or both the optical ports 231, 235 on the side of the redistribution structure 170 is/are omitted. In at least one embodiment, the optical coupling from the side of a redistribution structure as described with respect to FIG. 2C is applicable to both IC devices having transparent heat spreaders and IC devices having metal heat spreaders. In some embodiments, the provision of multiple options or optical ports for optically coupling an IC device to external optical fibers makes it easier to mount, couple and/or operate the IC device with other external devices.

Figure 3A:
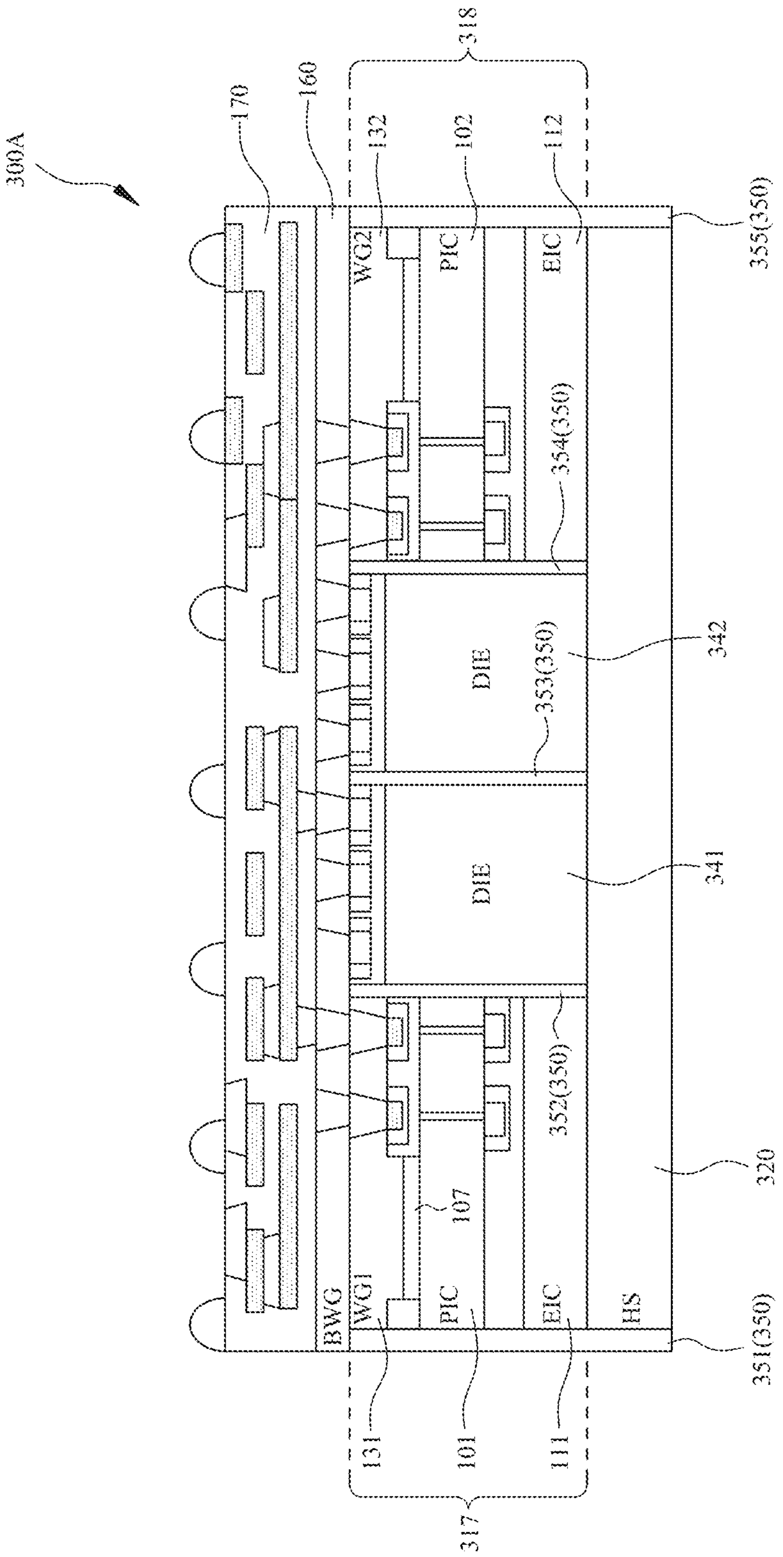
FIGS. 3A-3B are schematic cross-sectional views of various IC devices, in accordance with some embodiments.
Figure 3B:
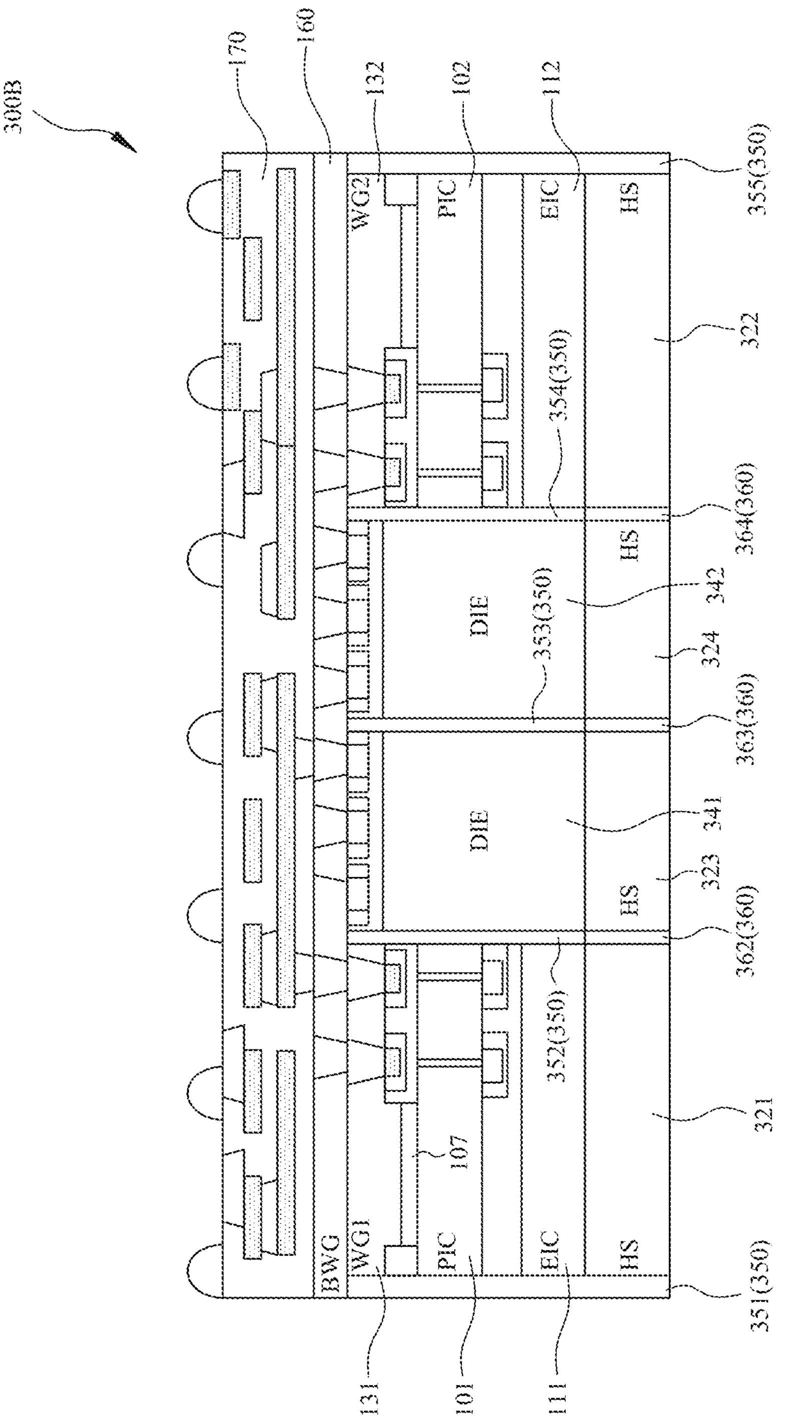

FIGS. 3A-3B are schematic cross-sectional views of IC devices 300A-300B, in accordance with some embodiments. Compared to the IC device 100, the IC devices 300A-300B comprise different heat spreader configurations. The IC device 300A in FIG. 3A comprises a common heat spreader for multiple chips and dies. The IC device 300B in FIG. 3B comprises individual heat spreaders each for a corresponding one of multiple chips and dies. Corresponding elements of the IC devices 100, 300A, 300B are designated by the same reference numerals.

In FIG. 3A, the IC device 300A comprises a common heat spreader 320 under and bonded to electronic ICs 111, 112 and dies 341, 342. In some embodiments, the dies 341, 342 correspond to the dies 141, 142 in the IC device 100. In at least one embodiment, the common heat spreader 320 supports and/or is bonded to the entire lower surfaces of the electronic ICs 111, 112 and the dies 341, 342 thereon. A molding compound 350 corresponding to the molding compound 150 extends around the common heat spreader 320, the dies 341, 342, a first stacked structure 317 comprising the electronic IC 111, photonic IC 101 and multilayer structure 131, and a second stacked structure 318 comprising the electronic IC 112, the photonic IC 102 and the multilayer structure 132. The molding compound 350 comprises various molding compound portions 351-355. Although in the cross-section of FIG. 3A, the molding compound portions 351-355 are separated from each other, in at least one embodiment, the molding compound portions 351-355 are contiguous to each other and form a single integrated body of the molding compound 350. The molding compound portions 351 and 355 define the outermost, peripheral surface of the IC device 300A. The molding compound portion 352 is between the first stacked structure 317 and the die 341, the molding compound portion 353 is between the dies 341, 342, and the molding compound portion 354 is between the second stacked structure 318 and the die 342. In one or more embodiments, the common heat spreader 320 comprises a metal heat spreader. In at least one embodiment, the common heat spreader 320 improves mechanical strength of the IC device 300A.

In FIG. 3B, the IC device 300B comprises individual heat spreaders 321, 322, 323, 324 correspondingly under and bonded to the electronic IC 111, electronic IC 112, die 341, die 342. The IC device 300B further comprises a spacer material 360 having a first portion 362 between the heat spreaders 321, 323, a second portion 363 between the heat spreaders 323, 324, and a third portion 364 between the heat spreaders 324, 322. In some embodiments, the spacer material 360 comprises a material other than the molding compound 350. In one or more embodiments, the spacer material 360 comprises a thermally isolating material for preventing heat generated by a chip or die, e.g., the die 341, from being transferred to another chip or die, e.g., the electronic IC 111, through the corresponding heat spreaders 323, 321. In at least one embodiment, the spacer material 360 comprises a compressible and/or stretchable to absorb stress due to different thermal expansions and/or contractions of the heat spreaders 321, 322, 323, 324, thereby preventing or reducing warpage of the IC device 300B. Example materials of the spacer material 360 include, but are not limited to, polymers, such as, PI, PBO, or the like. In one or more embodiments, the heat spreaders 321, 322, 323, 324 comprise metal heat spreaders.

Figure 4A:
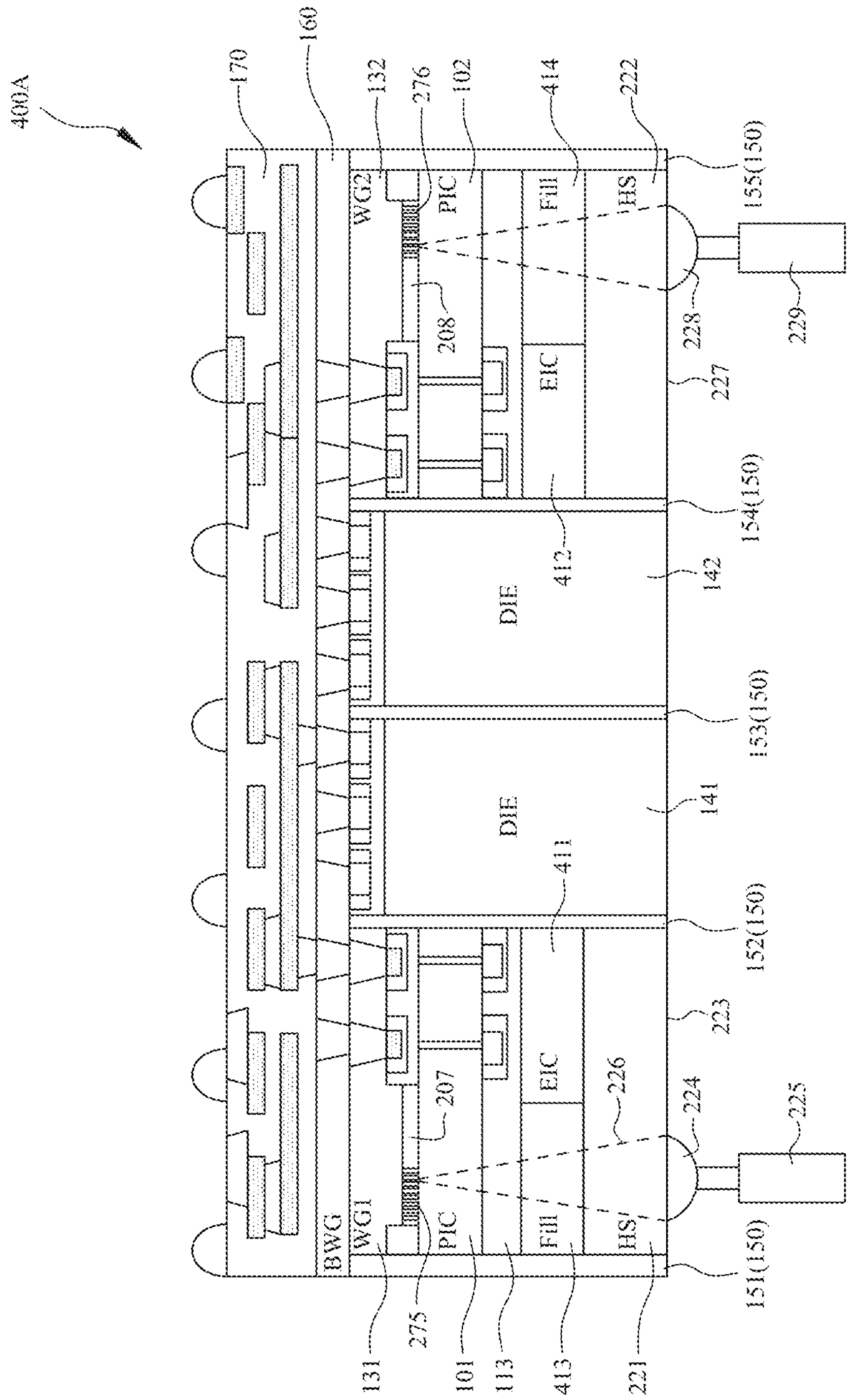
FIGS. 4A-4C are schematic cross-sectional views of one or more IC devices in optical connection with one or more optical fibers, in accordance with some embodiments.
Figure 4B:
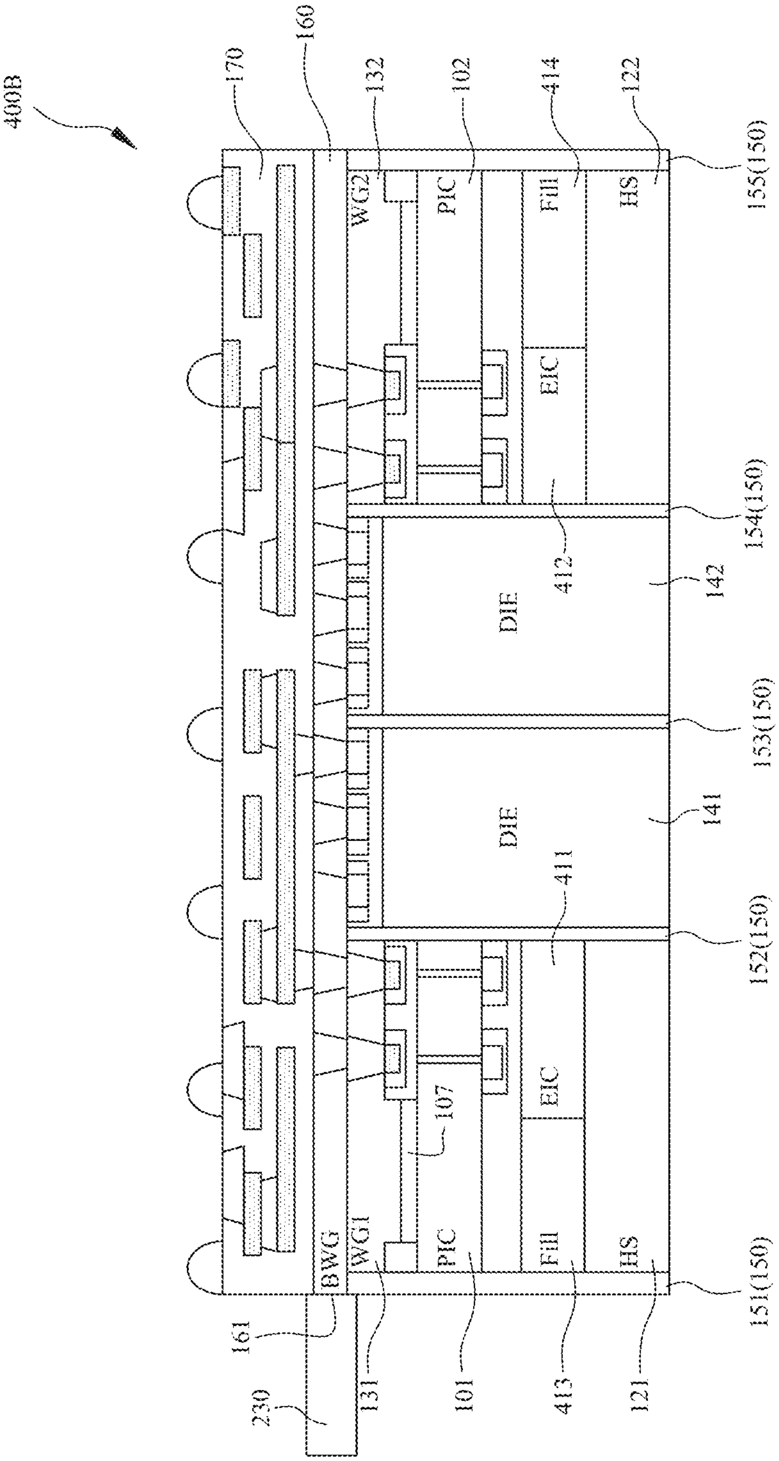
Figure 4C:
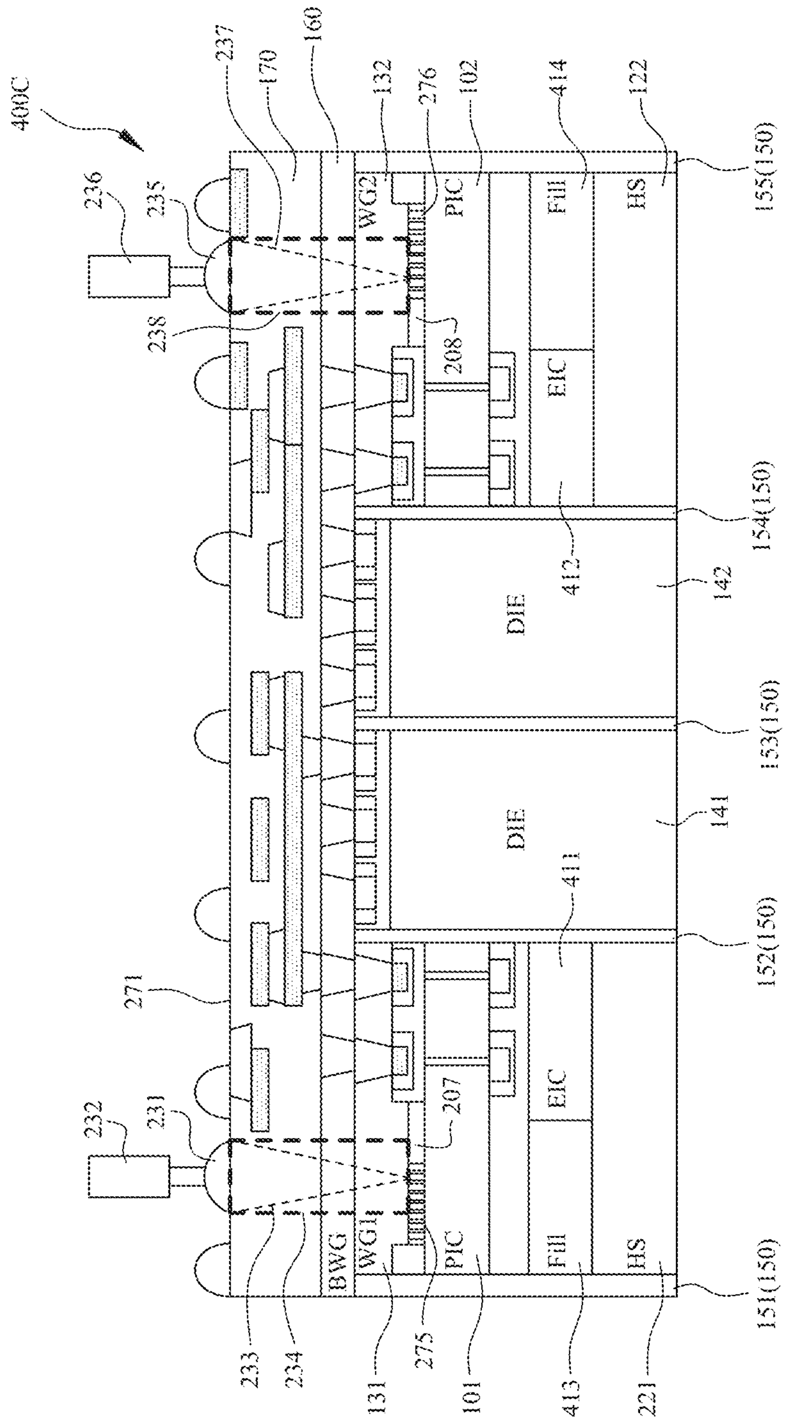

FIGS. 4A-4C are schematic cross-sectional views of IC devices 400A-400C, in accordance with some embodiments. The IC devices 400A-400C correspond to the IC devices 200A-200C, with differences being the smaller size of the corresponding electronic IC and the inclusion of a filling material in the IC devices 400A-400C. The filing material is schematically indicated in the drawings with a label "Fill." Corresponding elements of the IC devices 100, 200A-200C, 400A-400C are designated by the same reference numerals.

In FIG. 4A, the IC device 400A corresponds to the IC device 200A, but comprises an electronic IC 411 having a size or an area smaller than that of the photonic IC 101. To support a portion of the photonic IC 101 that is not supported by the smaller electronic IC 411, the IC device 400A comprises a filling material 413 adjacent the electronic IC 411, and between the photonic IC 101 and the transparent heat spreader 221. The IC device 400A further comprises an electronic IC 412 having a size or an area smaller than that of the photonic IC 102, and a filling material 414 adjacent the electronic IC 412 and between the photonic IC 102 and the transparent heat spreader 222. Example materials for the filling materials 413, 414 include, but are not limited to, Si, $SiO_2$, $Si_3N_4$, or the like. In at least one embodiment, the filling materials 413, 414 are formed by a deposition process after bonding the electronic ICs 411, 412 to the corresponding photonic ICs 101, 102. In one or more embodiments, a total size or area of the electronic IC 411 and the filling material 413 is equal to a size or area of the photonic IC 101, and/or a total size or area of the electronic IC 412 and the filling material 414 is equal to a size or area of the photonic IC 102.

In the example configuration in FIG. 4A, the filling material 413 is transparent to the light 226 carrying optical signals and input from the external optical fiber 225 through the lens 224. The light 226 passes through the filling material 413, the passivation layer 113 and the photonic IC 101 to be incident on the optical coupler 275. The filling material 414 is configured and/or arranged similarly to the filling material 413. In at least one embodiment, the arrangement of the filling material 413, which is transparent to light 226, between the lens 224 and the optical coupler 275 eliminates a requirement that the electronic IC 411 be transparent to light 226. As a result, various additional materials are available for manufacturing the electronic IC 411, which improves the manufacturing flexibility. In some embodiments, the electronic IC 411 is configured to control the photonic IC 101, and does not require or contain complex circuitry. Therefore, it is possible to manufacture the electronic IC 411 in a smaller size, and use the filling material 413 to fill a reaming space between the photonic IC 101 and the heat spreader 221. As a result, the cost for manufacturing electronic ICs is reduced in one or more embodiments.

In FIG. 4B, the IC device 400B corresponds to the IC device 200B, but comprises the smaller electronic ICs 411, 412 and corresponding filling materials 413, 414. In at least one embodiment, one or more advantages described herein are achievable by the IC device 400B.

In FIG. 4C, the IC device 400C corresponds to the IC device 200C, but comprises the smaller electronic ICs 411, 412 and corresponding filling materials 413, 414. In at least one embodiment, one or more advantages described herein are achievable by the IC device 400C.

Figure 5:
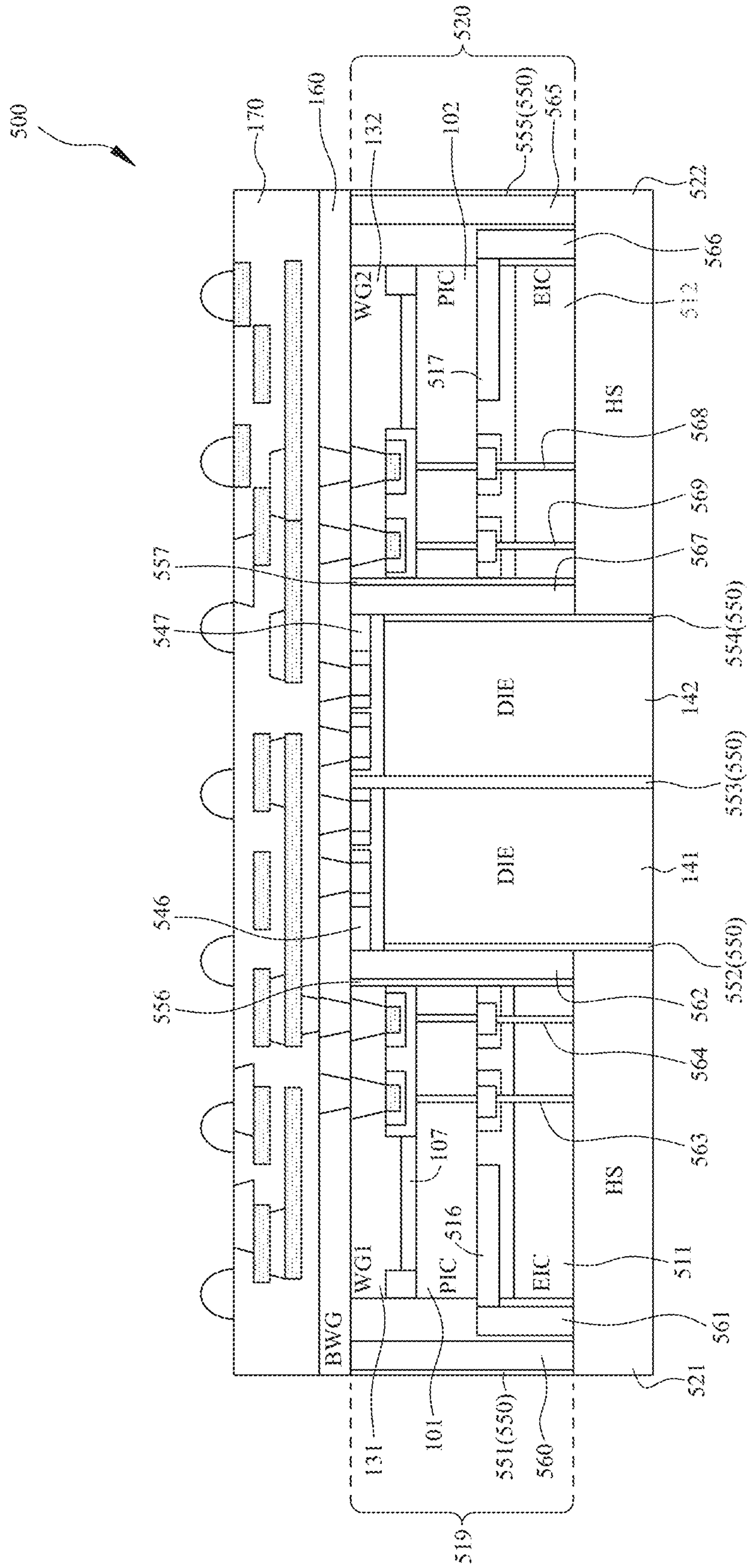
FIG. 5 is a schematic cross-sectional view of an IC device, in accordance with some embodiments.

FIG. 5 is a schematic cross-sectional view of an IC device 500, in accordance with some embodiments. Compared to the IC device 100, the IC device 500 comprises one or more through via structures for thermally coupling one or more of the chips and/or dies to the corresponding heat spreader(s). Corresponding elements of the IC devices 100, 500 are designated by the same reference numerals.

The IC device 500 comprises electronic ICs 511, 512 under and bonded to the corresponding photonic ICs 101, 102, heat spreaders 521, 522 under and bonded to the corresponding electronic ICs 511, 512, and a molding compound 550 extending around the electronic ICs 511, 512, the photonic ICs 101, 102, the multilayer structures 131, 132, and the dies 141, 142. In the IC device 100, the molding compound 150 extents around the heat spreaders 121, 122. In the IC device 500, the molding compound 550 is over the heat spreaders 521, 522.

Specifically, the molding compound 550 comprises various molding compound portions 551-557. Although in the cross-section of FIG. 5, the molding compound portions 551-557 are separated from each other, in at least one embodiment, the molding compound portions 551-557 are contiguous to each other and form a single integrated body of the molding compound 550. The molding compound portions 551 and 555 define an outermost part of the molding compound 550 and also define the outermost, peripheral surface of the IC device 500. The molding compound portion 552 is between the heat spreader 521 and the die 141. The molding compound portion 553 is between the dies 141, 142. The molding compound portion 554 is between the heat spreader 522 and the die 142. The molding compound portion 556 is between the die 141 and a first stacked structure 519 comprising the electronic IC 511, photonic IC 101 and multilayer structure 131. The molding compound portion 557 is between the die 142 and a second stacked structure 520 comprising the electronic IC 512, photonic IC 102 and multilayer structure 132. In the example configuration in FIG. 5, the molding compound portions 556, 557 have a greater width than the molding compound portions 552, 554.

Compared to the electronic ICs 111, 112 in the IC device 100, the electronic ICs 511, 512 additionally comprise TSVs 563, 564, 568, 569 physically and thermally coupled to the corresponding heat spreaders 521, 522. The TSVs 563, 564, 568, 569 are physically and thermally coupled to the further conductive features in the corresponding photonic ICs 101, 102. As a result, in one or more embodiments, it is possible to dissipate heat generated by the photonic ICs 101, 102, especially by active devices of the photonic ICs 101, 102, to the corresponding heat spreaders 521, 522 by the TSVs 563, 564, 568, 569 through the electronic ICs 511, 512.

Compared to the molding compound 150 in the IC device 100, the molding compound 550 additionally comprises one or more through-packaging-vias (TPVs), also referred to as through-InFO-via (TIVs), as additional heat dissipation paths to the heat spreaders 521, 522. For example, TPVs 560, 565 extend through the corresponding molding compound portions 551, 555, and thermally and physically connecting the corresponding heat spreaders 521, 522 to corresponding conductive features (not shown) in the multilayer structure 160. The conductive features in the multilayer structure 160 are thermally and physically connected, e.g., through the redistribution structure 170, to further conductive features (not shown) of the corresponding photonic ICs 101, 102 and/or the dies 141, 142. As a result, in one or more embodiments, it is possible to dissipate heat generated by the photonic ICs 101, 102, and/or by the dies 141, 142 through the TPVs 560, 565 to the corresponding heat spreaders 521, 522.

TPVs 561, 566 are formed in the corresponding molding compound portions 551, 555, and thermally and physically connecting the corresponding heat spreaders 521, 522 to corresponding conductive patterns 516, 517 over the upper surfaces of the corresponding electronic ICs 511, 512. As a result, in one or more embodiments, it is possible to further dissipate heat generated by the electronic ICs 511, 512 through the TPVs 561, 566 to the corresponding heat spreaders 521, 522.

TPVs 562, 567 extend through the corresponding molding compound portions 556, 557, and thermally and physically connecting the corresponding heat spreaders 521, 522 to corresponding conductive patterns 546, 547 over the upper surfaces of the corresponding dies 141, 142. As a result, in one or more embodiments, it is possible to further dissipate heat generated by the dies 141, 142 through the TPVs 562, 567 to the corresponding heat spreaders 521, 522.

In some embodiments, in an electronic IC, most of the heat is generated at the device layer where the active elements of the electronic IC are arranged. TSVs, such as TSVs 563, 564, 568, 569, provide additional pathways for heat transfer from the device layer to the corresponding heat spreader at backside of the electronic IC. In at least one embodiment, heat transferring TSVs and/or TPVs are arranged in an outer peripheral part of the chip, die and/or system. A reason is that most of the heat is generated in the central area of each chip or die, and is needed to be transferred away. In some embodiments, one or more TSVs and/or TPVs are thermally and physically connected with the corresponding electronic IC through a redistribution structure.

Figure 6:
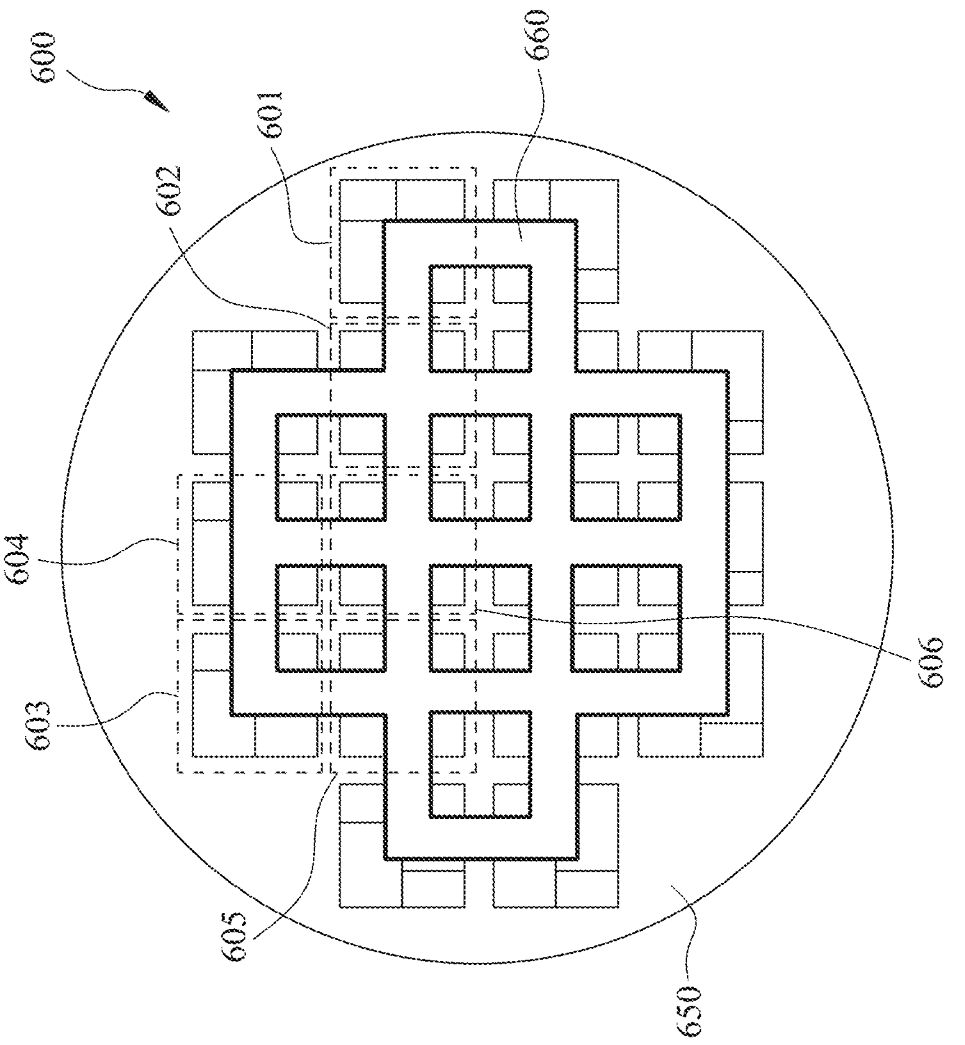
FIG. 6 is a schematic top view of a system-on-wafer (SoW) structure, in accordance with some embodiments.

FIG. 6 is a schematic top view of a system-on-wafer (SoW) structure 600, in accordance with some embodiments.

The SoW structure 600 comprises a plurality of photonic units some of which are designated at 601-606. Each of the photonic units 601-606 comprises a photonic IC, an electronic IC, a heat spreader, one or more multilayer structures with one or more waveguides therein. At least one of the photonic units 601-606 comprises at least one further die. In each of the photonic units 601-606, the photonic IC, electronic IC, heat spreader, multilayer structures and/or further die are configured and/or bonded to each other as described with respect to FIGS. 1A-5. The photonic units 601-606 are supported on a carrier 650. Example materials of the carrier 650 include, but are not limited to, glass, silicon, metal, molding compound, or the like. The photonic ICs in the photonic units 601-606 are optically coupled to each other by a waveguide array 660. In an example, the photonic units 601, 602 and the corresponding waveguide of the waveguide array 660 over and between the photonic units 601, 602 form an IC device corresponding one or more of the IC devices described with respect to FIGS. 1A-5. In some embodiments, after debonding the carrier 650 and an optional dicing operation, a complete system or IC package comprising the photonic units 601, 602 and the corresponding waveguide is obtained without further packaging operation or process. A more complex or simpler system or IC package is obtainable. For example, a more complex system or IC package comprising thereon the photonic units 603-606 and the corresponding waveguides can be obtained. In some embodiments, no dicing operation is performed, i.e., all photonic units on the carrier 650 configure a single, complete system or IC package. In at least one embodiment, one or more advantages described herein are achievable by at least one system, IC package or IC device obtained from the SoW structure 600.

FIGS. 7A-7L are schematic cross-sectional views of an IC device 700 at various stages in a manufacturing process, in accordance with some embodiments. In some embodiments, the manufacturing process and/or modifications thereof are usable to manufacture one or more IC devices described with respect to FIGS. 1A-5. In the examples in FIGS. 7A-7L, the IC device 700 being manufactured corresponds to the IC device 100.

Figure 7A:
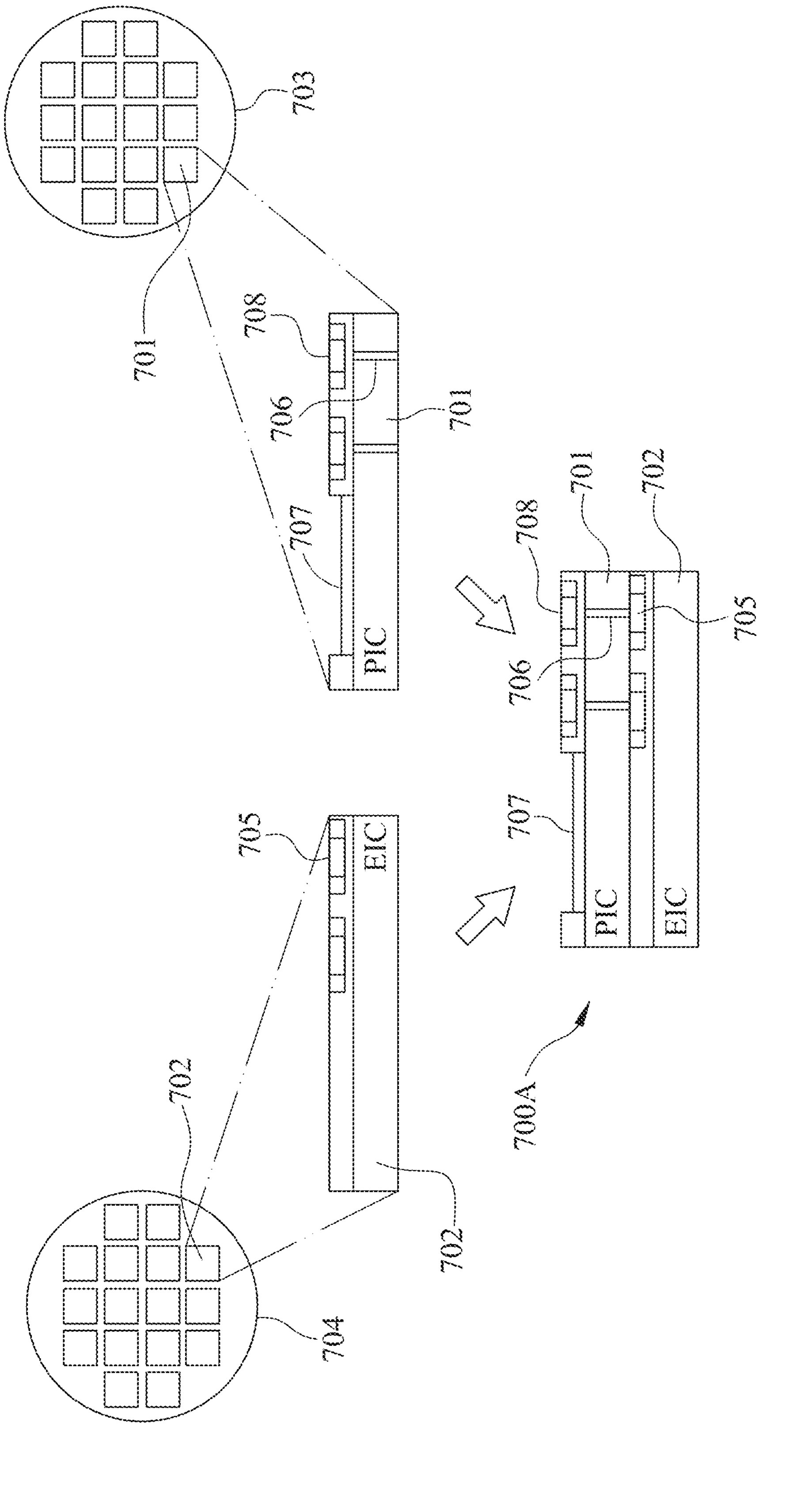
FIGS. 7A-7L are schematic cross-sectional views of an IC device at various stages in a manufacturing process, in accordance with some embodiments.

In FIG. 7A, a photonic IC 701 is singulated from a first wafer 703 on which a plurality of photonic ICs are manufactured. An electronic IC 702 is singulated from a second wafer 704 on which a plurality of electronic ICs are manufactured. The photonic IC 701 comprises a TSV 706, a waveguide 707, and a conductive pad 708. The electronic IC 702 comprises a conductive pad 705. In at least one embodiment, the photonic IC 701, electronic IC 702, conductive pad 705, TSV 706, waveguide 707, and conductive pad 708 correspond to photonic IC 101, electronic IC 111, conductive pad 115, TSV 106, waveguide 107, and conductive pad 105 in IC device 100. The photonic IC 701 is bonded to the electronic IC 702 in a die bonding process. An example binding technique comprises hybrid bonding as described herein. A resulting structure 700A is obtained in which the conductive pad 705 is electrically coupled to the TSV 706.

Figure 7B:
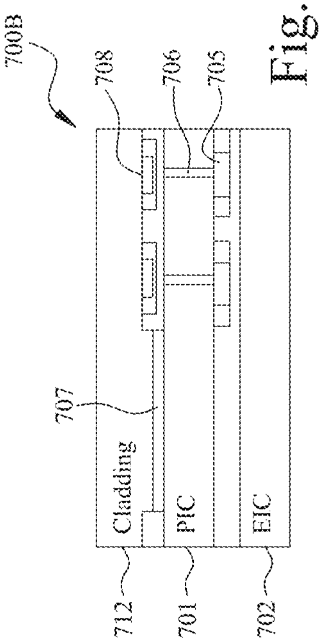

In FIG. 7B, a cladding layer 712 is deposited over the waveguide 707 of the photonic IC 701 in the structure 700A. Example materials of the cladding layer 712 include, but are not limited to, PI, BCB, PBO, a fluorinated polymer, polynorbornene, silicone, siloxane acrylates, epoxy nano-filled phenol resin, or the like. Other materials, including non-polymer materials, are within the scopes of various embodiments. In at least one embodiment, the cladding layer 712 is deposited by a deposition process including, but not limited to, plasma vapor deposition (PVD), chemical vapor deposition (CVD), plasma enhanced CVD (PECVD), or the like. In some embodiments, a grinding and/or a chemical mechanical polishing (CMP) process are performed to remove excess portions of the cladding layer 712. A resulting structure 700B is obtained.

Figure 7C:
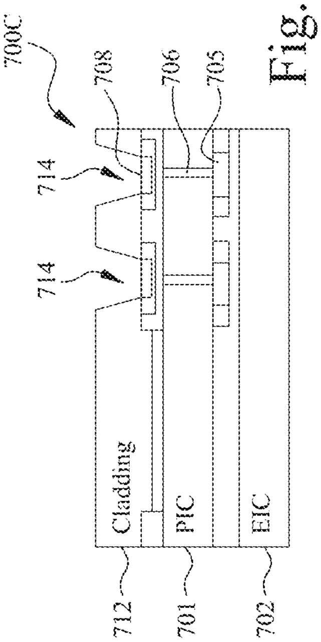

In FIG. 7C, the cladding layer 712 is patterned using photolithography and/or etching processes to form openings 714 which expose the corresponding, underlying conductive pads, e.g., conductive pad 708 of the photonic IC 701. In at least one embodiment, the patterned cladding layer 712 corresponds to the cladding layer 135 in the IC device 100. A resulting structure 700C is obtained.

Figure 7D:
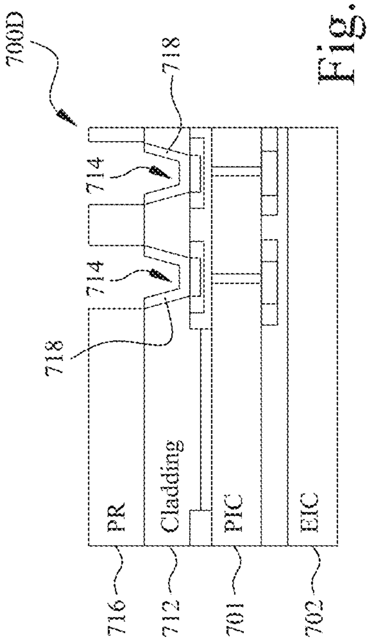

In FIG. 7D, a photoresist layer 716 is deposited over the structure 700C to cover the cladding layer 712, and then patterned to include openings corresponding to the openings 714. Photoresists are schematically indicated in the drawings with a label "PR." A seed layer 718, e.g., a conductive material, is formed over the walls of the openings 714 using, for example, a sputtering process, an electrochemical plating process, an electroless plating process, or the like. A resulting structure 700D is obtained.

Figure 7E:
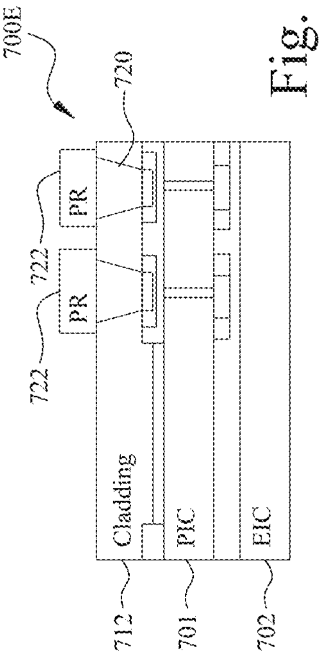

In FIG. 7E, a conductive material is filled in the openings 714 to form corresponding via structures 720. For example, Cu is deposited in the openings 714, over the seed layer 718, by a deposition process. The photoresist layer 716 is then removed, e.g., by a plasma ashing or wet strip process. A planarization process such as, CMP, is performed next. After the planarization process, a photoresist layer 722 is deposited over the obtained structure and patterned to cover regions where a waveguide is not to be formed. A resulting structure 700E is obtained.

Figure 7F:
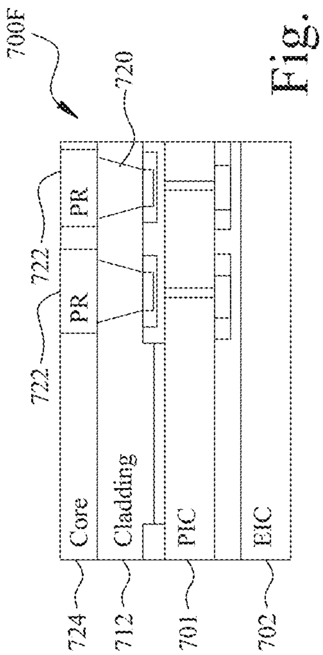

In FIG. 7F, a core layer 724 is deposited over regions where a waveguide is to be formed. Example materials of the core layer 724 include, but are not limited to, PBO, PI or the like. Other materials, including non-polymer materials, are within the scopes of various embodiments. In at least one embodiment, the core layer 724 is deposited by a deposition process as described herein. In at least one embodiment, the core layer 724 corresponds to the core layer 136 in the IC device 100. A resulting structure 700F is obtained.

Figure 7G:
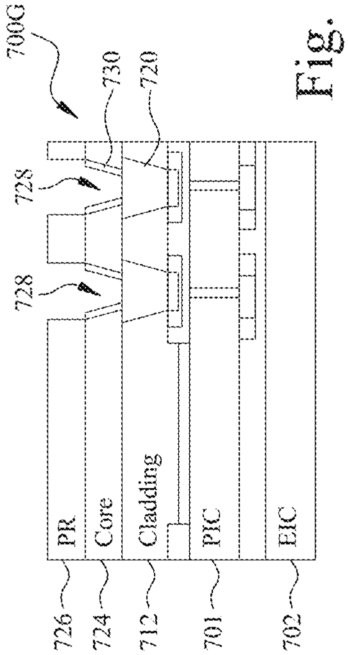

In FIG. 7G, a photoresist layer 726 is deposited over the structure 700F, and patterned to include openings 728 over the underlying via structures 720. A seed layer 730, e.g., a conductive material, is formed over the walls of the openings 728 using, for example, a sputtering process, an electrochemical plating process, an electroless plating process, or the like. A resulting structure 700G is obtained.

Figure 7H:
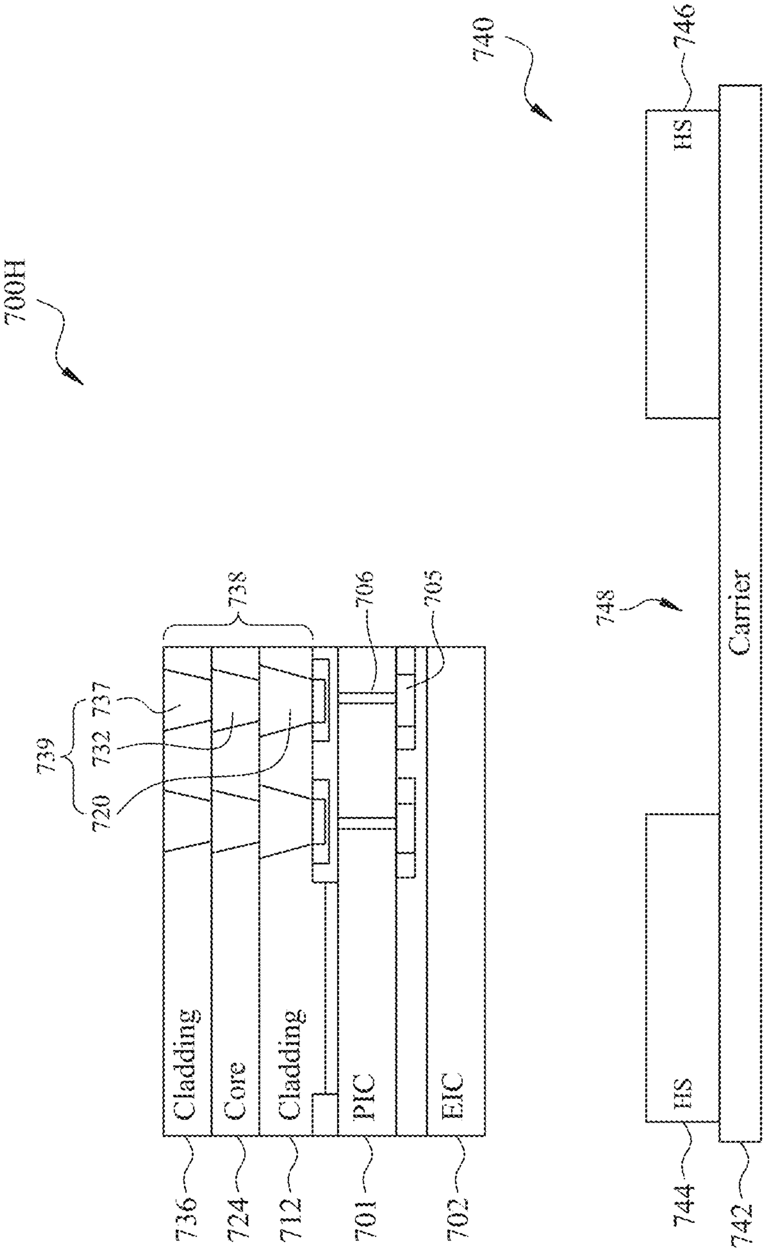

In FIG. 7H, a conductive material is filled in the openings 728 to form corresponding via structures 732. For example, Cu is deposited in the openings 728, over the seed layer 730, by a deposition process. The photoresist layer 726 is then removed, e.g., by a plasma ashing or wet strip process. A planarization process such as, CMP, is performed next. After the planarization process, the processes described with respect to FIGS. 7B-7E are repeated to form a cladding layer 736 over the core layer 724. The cladding layer 736 has via structures 737 over and electrically coupled to the underlying via structures 732. A resulting structure 700H is obtained.

The structure 700H comprises a multilayer structure 738 having the cladding layer 712, core layer 724 and cladding layer 736. In at least one embodiment, the cladding layer 736 and multilayer structure 738 correspond to the cladding layer 137 and the multilayer structure 131 of the IC device 100. The cladding layer 712, core layer 724 and cladding layer 736 form a waveguide which, in at least one embodiment, corresponds to the waveguide WG1 of the IC device 100. For simplicity, in the figures following FIG. 7H, the via structures 720, 732, 733 are referred to as a via structure 739, and the detailed layers inside a multilayer structure such as the multilayer structure 738 are omitted.

In FIG. 7H, a support structure 740 is prepared. The support structure 740 comprises a carrier 742 and heat spreaders 744, 746 releasably attached to the carrier 742, e.g., by a releasable adhesive layer. The heat spreaders 744, 746 are spaced from each other by a region 748. In at least one embodiment, the heat spreaders 744, 746 correspond to heat spreaders 121, 122 in the IC device 100. In some embodiments, the carrier 742 includes glass, ceramic, or other suitable material to provide structural support during the formation of various features in the IC device.

Figure 7I:
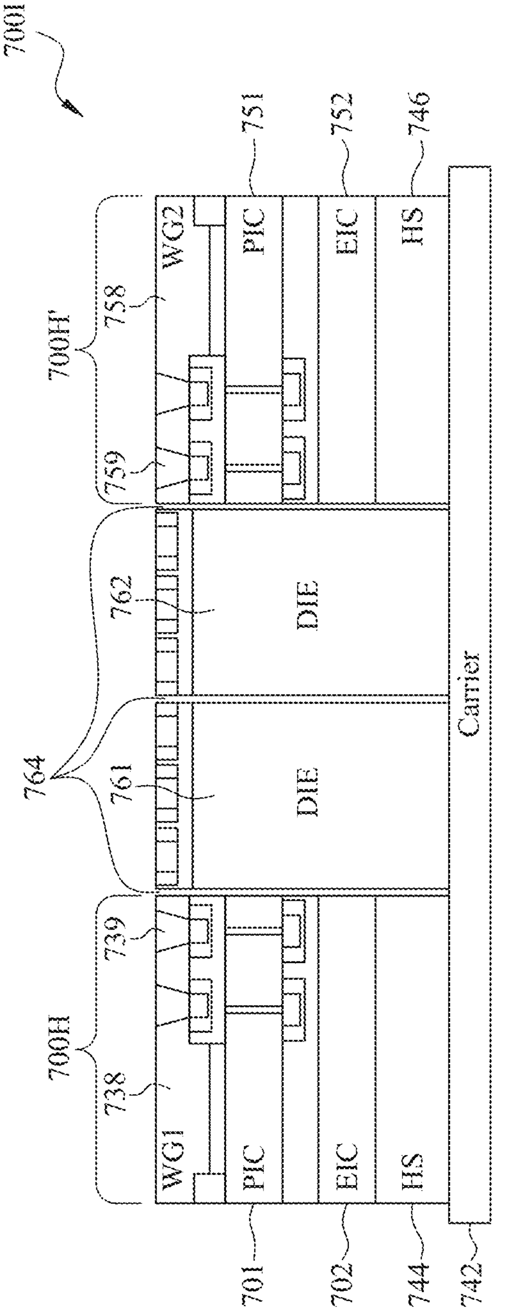

In FIG. 7I, the structure 700H is bonded to the heat spreader 744. A structure 700H' formed in a manner similar to the structure 700H is bonded to the heat spreader 746. The structure 700H' comprises an electronic IC 752, an photonic IC 751 over and bonded to the electronic IC 752, and a multilayer structure 758 over the photonic IC 751. The multilayer structure 758 comprises therein a waveguide WG2, and a via structure 759 corresponding to the via structure 739 in the multilayer structure 738. Dies 761, 762 are releasably bonded to the carrier 742 in the region 748. In at least one embodiment, the electronic IC 752, photonic IC 751, multilayer structure 758 and dies 761, 762 correspond to the electronic IC 112, photonic IC 102, multilayer structure 132 and dies 141, 142 in the IC device 100. In some embodiments, hybrid bonding is performed to bond the electronic ICs 702, 752 to the corresponding heat spreaders 744, 746. The bonding perform to leave spaces 764 between the dies 761, 762, between the die 761 and the adjacent structure 700H, and between the die 762 and the adjacent structure 700H'. A resulting structure 700I is obtained.

Figure 7J:
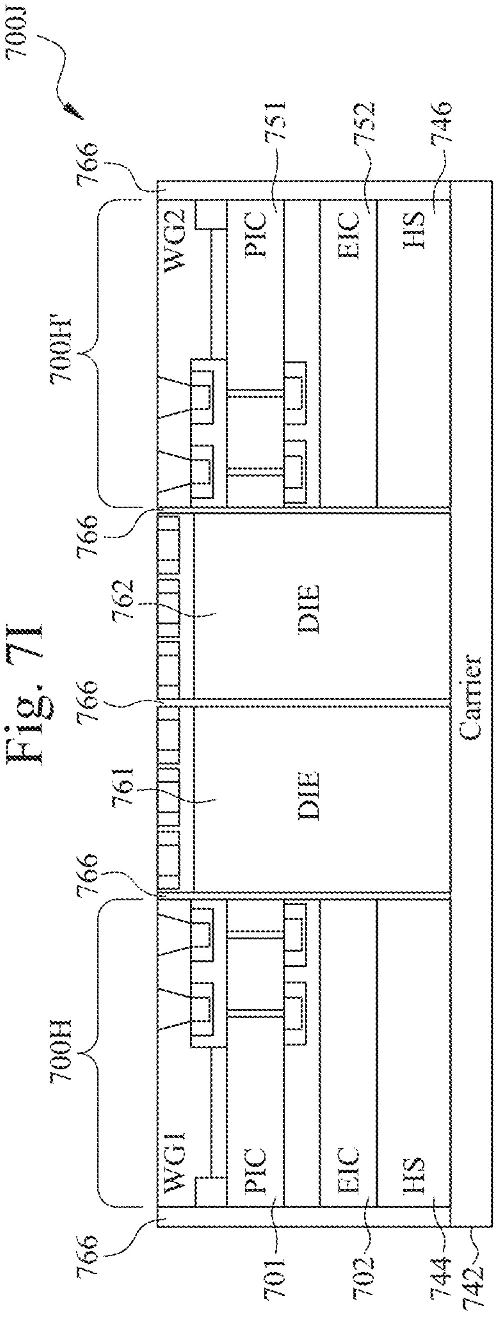

In FIG. 7J, a molding compound 766 is formed over the carrier 742 and around the structures 700H, 700H' and the dies 761, 762, and also fills in the spaces 764. Example materials of the molding compound 766 include, but are not limited to, epoxy resin, a molding underfill, or the like. In some embodiments, the molding compound 766 is formed by compressive molding, transfer molding, liquid encapsulant molding or the like. In some embodiments, the molding compound 766 corresponds to the molding compound 150 in the IC device 100. A planarization process such as, CMP, is performed. A resulting structure 700J is obtained.

Figure 7K:
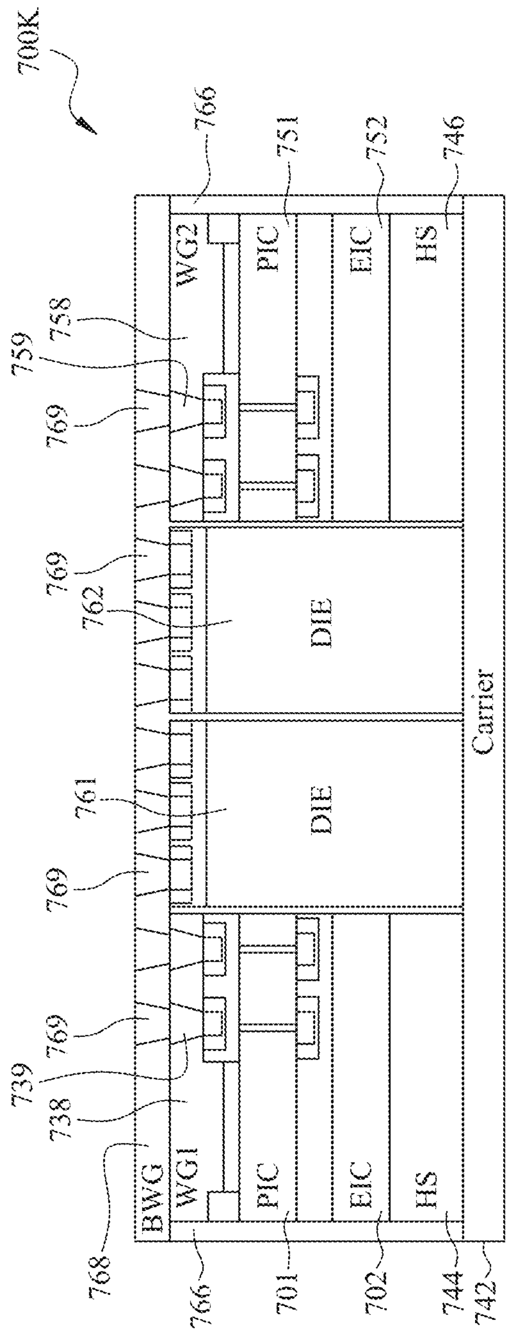

In FIG. 7K, the processes described with respect to FIGS. 7F-7H are repeated to form a core layer over the cladding layers of the waveguides WG1, WG2 and over the molding compound 766, and a further cladding layer over the core layer. As a result, a multilayer structure 768 having therein a bridging waveguide BWG is formed over the waveguides WG1, WG2 and the dies 761, 762. The formation of the multilayer structure 768 by repeating the processes described with respect to FIGS. 7F-7H further forms, in the multilayer structure 768, various via structures 769 over and in electrical connection with underlying conductive pads of the dies 761, 762, and/or the via structures 739, 759 in the underlying multilayer structures 738, 758. In some embodiments, the multilayer structure 768 corresponds to the multilayer structure 160 of the IC device 100. A resulting structure 700K is obtained.

Figure 7L:
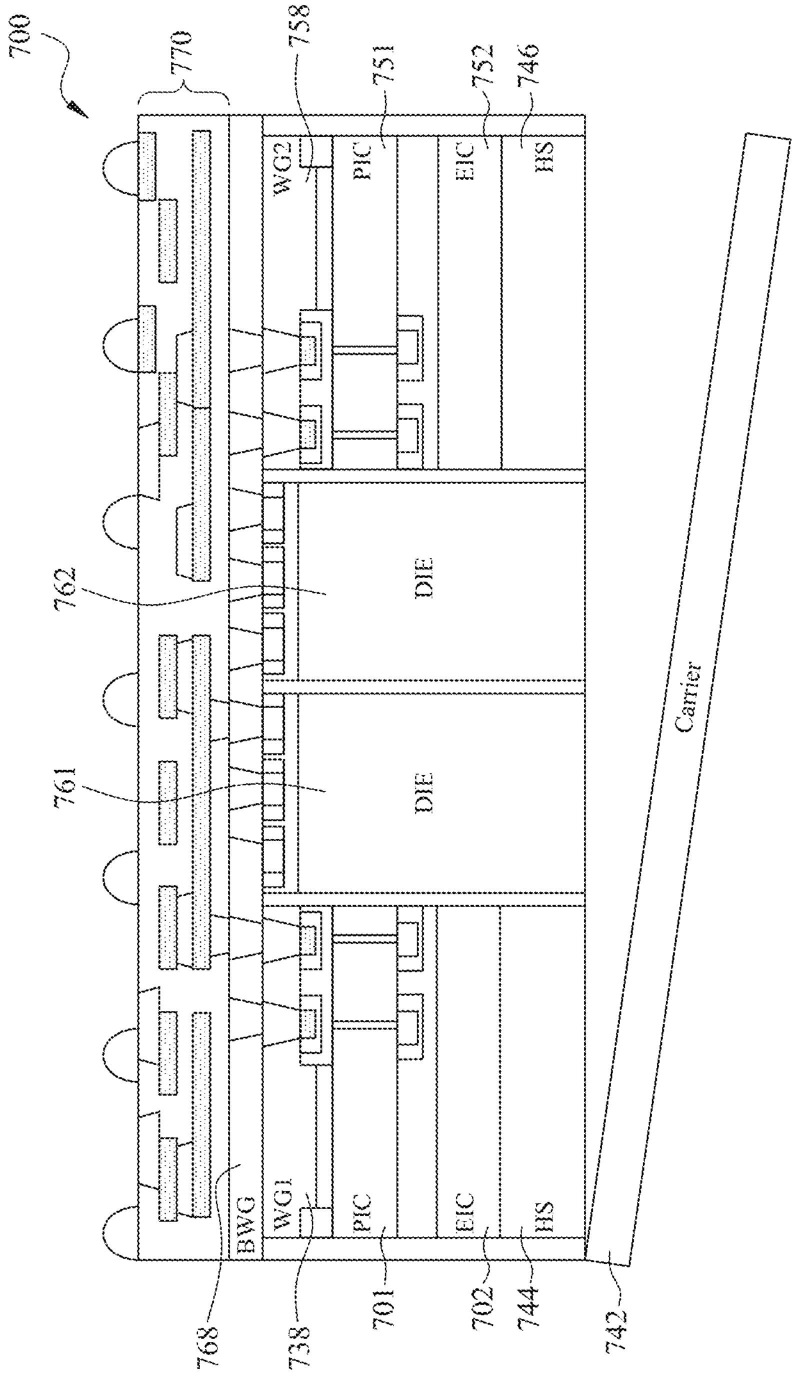

In FIG. 7L, a redistribution layer 770 is formed over the multilayer structure 768, by sequentially depositing and patterning dielectric layers and metal layers. The redistribution layer 770 electrically couples the die 761 to at least one of the photonic IC 701 or electronic IC 702, and the die 762 to at least one of the photonic IC 751 or electronic IC 752. In some embodiments, the redistribution layer 770 corresponds to the redistribution structure 170 in the IC device 100. The carrier 742 is next removed or debonded from the heat spreaders 744, 746 and the dies 761, 762. The IC device 700 is obtained. In at least one embodiment, one or more advantages described herein are achievable by the IC device 700.

Figure 7M:
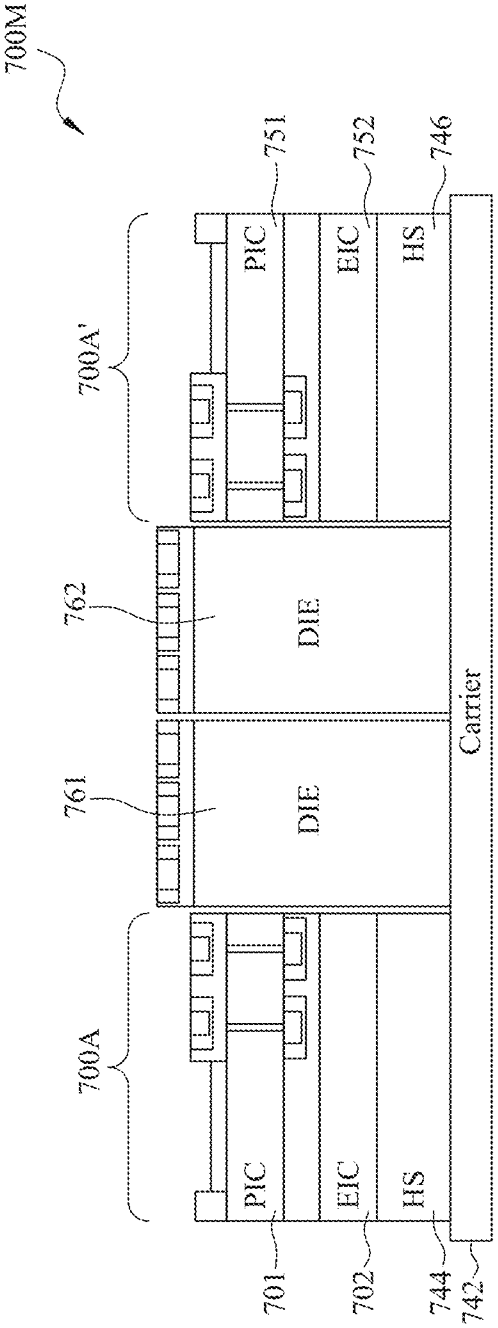
FIG. 7M is a schematic cross-sectional view of an IC device at a stage in a manufacturing process, in accordance with some embodiments.

FIG. 7M is a schematic cross-sectional view of an IC device at a stage in a manufacturing process, in accordance with some embodiments. Corresponding elements in FIGS. 7A-7M are designated by the same reference numerals.

In the process described with respect to FIGS. 7A-7L, the multilayer structures 738, 758 with the corresponding waveguides WG1, WG2 therein are formed before bonding the electronic ICs 702, 752 to the corresponding heat spreaders 744, 746 on the carrier 742. In a modified process in accordance with some embodiments, the multilayer structures 738, 758 with the corresponding waveguides WG1, WG2 therein are formed after bonding the electronic ICs 702, 752 to the corresponding heat spreaders 744, 746 on the carrier 742.

For example, as illustrated in FIG. 7M, after the chip bonding described with respect to FIG. 7A, the structure 700A is bonded to the heat spreader 744, and a structure 700A' formed in a manner similar to the structure 700A is bonded to the heat spreader 746. Dies 761, 762 are releasably bonded to the carrier 742 in the region 748 as described with respect to FIG. 7I. A resulting structure 700M is obtained. A molding compound is formed over the carrier 742 and around the structure 700M, as described with respect to FIG. 7J. Subsequently, one or more processes described with respect to FIGS. 7B-7G are performed several times to obtain the multilayer structures 738, 758, 768 with the corresponding waveguides WG1, WG2, BWG therein. Then, the redistribution layer 770 is formed and the carrier 742 is removed, as described with respect to FIG. 7L. A resulting IC device corresponds to the IC device 700 is thus obtained.

In the described process in accordance with some embodiments, while forming the multilayer structures 738, 758, 768 with the corresponding waveguides WG1, WG2, BWG therein, one or more additional patterning operations are performed to form one or more optical couplers as described with respect to FIGS. 1B-1H.

Figure 8A:
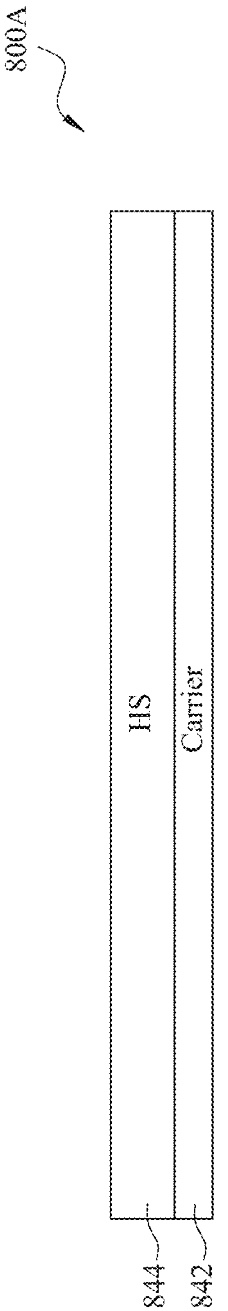
FIG. 8A is a schematic cross-sectional view of a support structure.
Figure 8B:
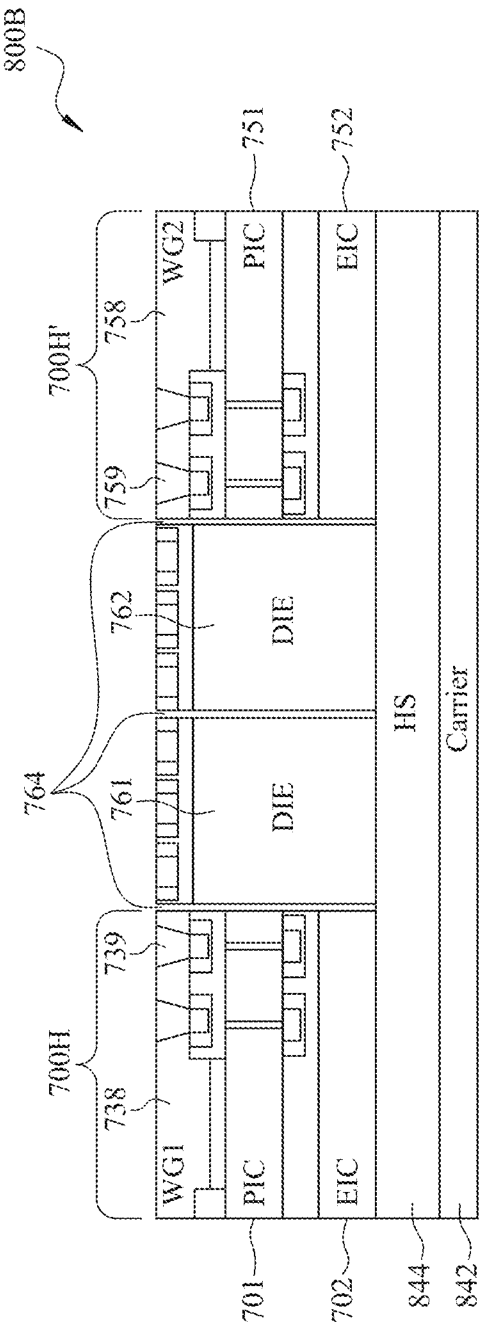
FIG. 8B is a schematic cross-sectional view of an IC device on the support structure during a manufacturing process, in accordance with some embodiments.

FIG. 8A is a schematic cross-sectional view of a support structure 800A, and FIG. 8B is a schematic cross-sectional view of an IC device 800B on the support structure 800A during a manufacturing process, in accordance with some embodiments. Corresponding elements in FIGS. 7A-7M, 8A-8B are designated by the same reference numerals.

In FIG. 8A, the support structure 800A comprises a carrier 842 and a heat spreader 844 releasably attached to the carrier 842. In at least one embodiment, the heat spreader 844 corresponds to the common heat spreader 320 described with respect to FIG. 3A.

In FIG. 8B, the structures 700H, 700H' and dies 761, 762 are bonded, e.g., by hybrid bonding, to the heat spreader 844 which is a common heat spreader for the structures 700H, 700H' and dies 761, 762. Further processes as described with respect to FIGS. 7J-7L are next performed to complete the IC device. In some embodiments, the resulting IC device corresponds to the IC device 300A which also has a common heat spreader.

Figure 9A:
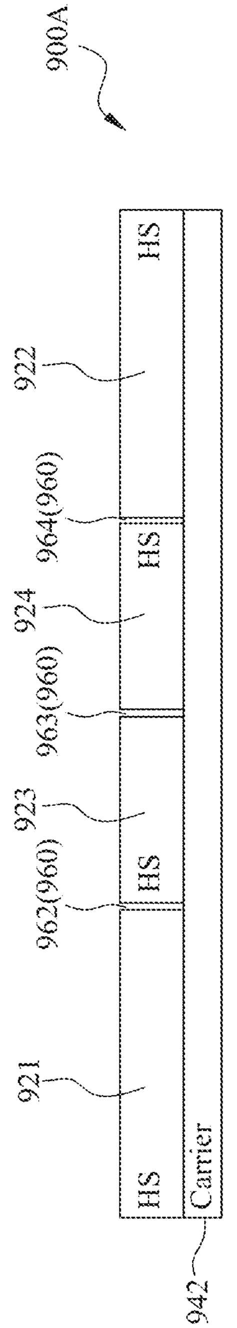
FIG. 9A is a schematic cross-sectional view of a support structure.
Figure 9B:
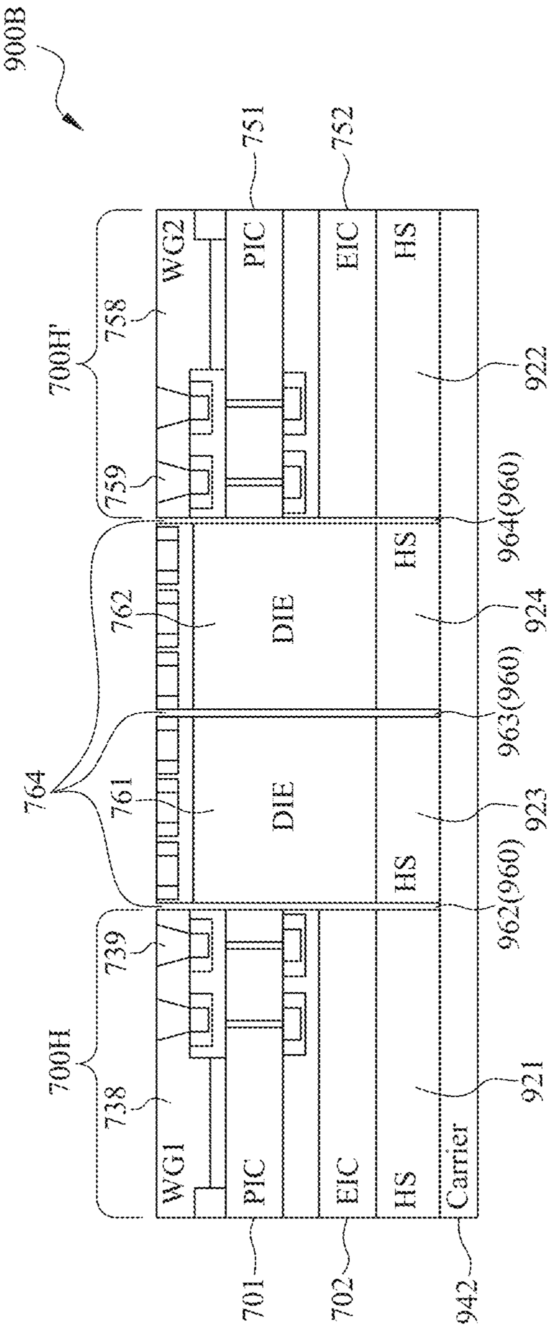
FIG. 9B is a schematic cross-sectional view of an IC device on the support structure during a manufacturing process, in accordance with some embodiments.

FIG. 9A is a schematic cross-sectional view of a support structure 900A, and FIG. 9B is a schematic cross-sectional view of an IC device 900B on the support structure 900A during a manufacturing process, in accordance with some embodiments. Corresponding elements in FIGS. 7A-7M, 9A-9B are designated by the same reference numerals.

In FIG. 9A, the support structure 900A comprises a carrier 942 and a plurality of heat spreaders 921, 922, 923, 924 spaced from each other by portions 962-964 of a spacer material 960. In at least one embodiment, the heat spreaders 921, 922, 923, 924 and portions 962-964 of the spacer material 960 correspond to heat spreaders 321, 322, 323, 324 and portions 362-364 of the spacer material 360 in the IC device 300B. Example materials of the spacer material 960 include, but are not limited to, polymers, such as, PI, PBO, or the like. In one or more embodiments, the heat spreaders 921, 922, 923, 924 comprise metal heat spreaders.

In FIG. 9B, the structures 700H, 700H' and dies 761, 762 are bonded, e.g., by hybrid bonding, to the corresponding individual heat spreaders 921, 922, 923, 924. Further processes as described with respect to FIGS. 7J-7L are next performed to complete the IC device. In some embodiments, the resulting IC device corresponds to the IC device 300B.

Figure 10:
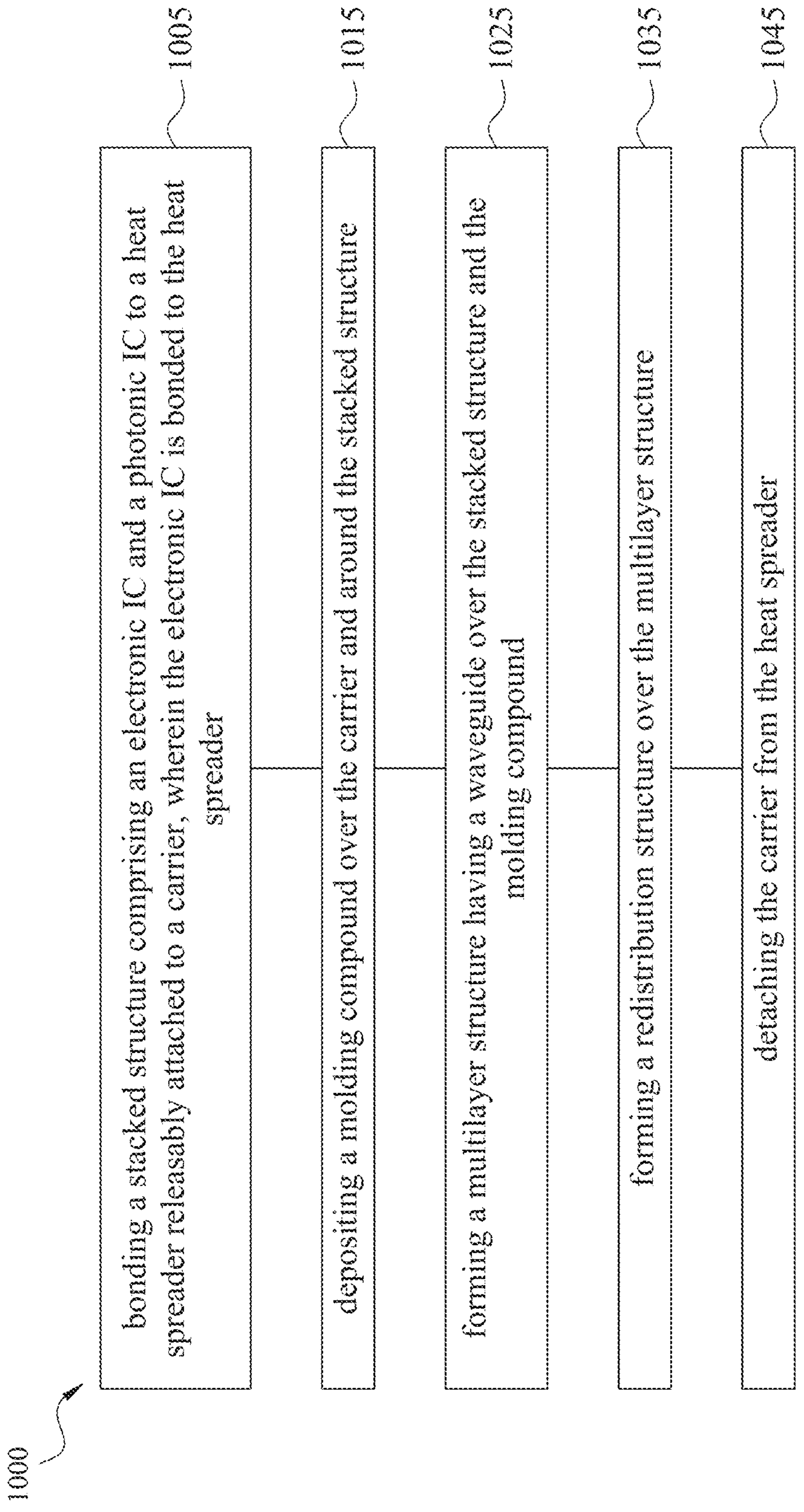
FIG. 10 is flowchart of a method, in accordance with some embodiments.

FIG. 10 is flowchart of a method 1000, in accordance with some embodiments. In at least one embodiment, the method 1000 is usable to manufacture one or more of the IC devices described with respect to FIGS. 1A-6.

At operation 1005, a stacked structure comprising an electronic IC and a photonic IC is bonded to a heat spreader releasably attached to a carrier, wherein the electronic IC is bonded to the heat spreader. For example, as described with respect to one or more of FIGS. 7H, 7M, 8B, 9B, a stacked structure 700H or 700A comprising an electronic IC 702 and a photonic IC 701 is bonded to a corresponding heat spreader 744, 844, 921 releasably attached to a corresponding carrier 742, 842, 942, such that the electronic IC 702 is bonded to the heat spreader.

At operation 1015, a molding compound is deposited over the carrier and around the stacked structure. For example, as described with respect to FIG. 7J, a molding compound 766 is deposited over the carrier 742 and around the stacked structure 700H.

At operation 1025, a multilayer structure is formed over the stacked structure and the molding compound to form a waveguide. For example, as described with respect to FIGS. 7B-7H and 7K, a multilayer structure 738, 768 is sequentially deposited and patterned. As a result, a waveguide WG1, BWG is formed in in the multilayer structure 738, 768 to be optically coupled to the photonic IC 701.

At operation 1035, a redistribution structure is formed over the multilayer structure. For example, as described with respect to FIG. 7L, a redistribution layer 770 is sequentially deposited and patterned over the multilayer structure 738, 768, so as to be electrically coupled to the photonic IC 701.

At operation 1045, the carrier is detached from the heat spreader, for example, as described with respect to FIG. 7L. In at least one embodiment, one or more advantages described herein are achievable by one or more IC devices manufactured in accordance with the method 1000.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In a method in accordance with some embodiments, a stacked structure comprising an electronic integrated circuit (IC) and a photonic IC is bonded to a heat spreader releasably attached to a carrier. A first multilayer structure is sequentially deposited and patterned over the stacked structure to form, in the first multilayer structure, a first waveguide optically coupled to the photonic IC. A redistribution structure is sequentially deposited and patterned over the first multilayer structure, the redistribution structure electrically coupled to the photonic IC. The carrier is detached from the heat spreader.

In a method in accordance with some embodiments, a stacked structure comprising an electronic component and an optical component is bonded to a heat spreader, wherein the electronic component is bonded to the heat spreader. A molding compound is deposited over the heat spreader and around the stacked structure. The method further comprises forming at least one of at least one first through via structure, at least one second through via structure, or at least one third through via structure. The at least one first through via structure extends through the electronic component, and thermally couples the optical component to the heat spreader. The at least one second through via structure extends through the molding compound, and thermally couples conductive features between the optical component and the electronic component to the heat spreader. The at least one third through via structure extends through the molding compound, and thermally couples conductive features over the optical component to the heat spreader.

In a method in accordance with some embodiments, a plurality of stacked structures, each comprising an electronic component and an optical component, is bonded to one or more heat spreaders, wherein the electronic component of each stacked structure of the plurality of stacked structures is bonded to a corresponding heat spreader of the one or more heat spreaders. An array of waveguides is formed over the plurality of stacked structures. The array of waveguides comprises at least one waveguide optically coupling the optical components of adjacent first and second stacked structures among the plurality of stacked structures. The at least one waveguide extends over and across a spacing between the first and second stacked structures. A dicing operation is performed to obtain an integrated circuit (IC)

package comprising: the first and second stacked structures, at least one corresponding heat spreader bonded to the electronic components of the first and second stacked structures, and the at least one waveguide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

bonding a stacked structure comprising an electronic integrated circuit (IC) and a photonic IC to a heat spreader releasably attached to a carrier;

sequentially depositing and patterning a first multilayer structure over the stacked structure to form, in the first multilayer structure, a first waveguide optically coupled to the photonic IC;

sequentially depositing and patterning a redistribution structure over the first multilayer structure, the redistribution structure electrically coupled to the photonic IC; and detaching the carrier from the heat spreader.

2. The method of claim 1, further comprising, before said bonding:

sequentially depositing and patterning a second multilayer structure over the stacked structure to form, in the second multilayer structure, a second waveguide optically coupled to the photonic IC, wherein the first multilayer structure is formed over the second multilayer structure, and the first waveguide is optically coupled to the photonic IC through the second waveguide.

3. The method of claim 2, further comprising:

depositing a molding compound over the carrier, around the stacked structure and around the second multilayer structure.

4. The method of claim 1, wherein said bonding comprises bonding the electronic IC to the heat spreader.

5. The method of claim 1, further comprising:

depositing a molding compound over the carrier and around the stacked structure.

6. The method of claim 5, further comprising, after said depositing the molding compound and before forming the first multilayer structure:

sequentially depositing and patterning a second multilayer structure over the stacked structure to form, in the second multilayer structure, a second waveguide optically coupled to the photonic IC, wherein the first multilayer structure is formed over the second multilayer structure, and the first waveguide is optically coupled to the photonic IC through the second waveguide.

7. The method of claim 1, further comprising, after said bonding and before forming the first multilayer structure:

sequentially depositing and patterning a second multilayer structure over the stacked structure to form, in the second multilayer structure, a second waveguide optically coupled to the photonic IC, wherein the first multilayer structure is formed over the second multilayer structure, and the first waveguide is optically coupled to the photonic IC through the second waveguide.

8. The method of claim 1, further comprising forming at least one of:

a first optical port over the redistribution structure, the first optical port configured to direct incident light through the redistribution structure and the first multilayer structure onto an optical coupler of the photonic IC; or a second optical port over an exposed edge of the first waveguide.

9. The method of claim 1, wherein the heat spreader is transparent to light carrying optical signals input to or output from the photonic IC.

10. The method of claim 9, wherein the heat spreader comprises at least one selected from the group consisting of Si, doped Si, GaN, diamond, $Si_3N_4$, and $SiO_2$.

11. The method of claim 9, further comprising:

forming an optical port under the heat spreader, the optical port configured to direct incident light through the heat spreader, the electronic IC and a portion of the photonic IC, onto an optical coupler of the photonic IC.

12. The method of claim 1, wherein the heat spreader is a metal heat spreader comprising at least one selected from the group consisting of Cu, Al, Au, and Ag.

13. The method of claim 1, wherein an area of the electronic IC is smaller than an area of the photonic IC, and the method further comprises depositing a filling material adjacent the electronic IC, and between the photonic IC and the heat spreader.

14. The method of claim 13, wherein the filing material is transparent to light carrying optical signals input to or output from the photonic IC, and the method further comprises forming at least one of:

a first optical port under the heat spreader, the first optical port configured to direct incident light through the heat spreader, the filing material and a portion of the photonic IC, onto an optical coupler of the photonic IC;

a second optical port over the redistribution structure, the second optical port configured to direct incident light through the redistribution structure and the first multilayer structure onto the optical coupler of the photonic IC; or a third optical port over an exposed edge of the first waveguide.

15. A method, comprising:

bonding a stacked structure comprising an electronic component and an optical component to a heat spreader, wherein the electronic component is bonded to the heat spreader;

depositing a molding compound over the heat spreader and around the stacked structure; and forming at least one of at least one first through via structure extending through the electronic component, and thermally coupling the optical component to the heat spreader, at least one second through via structure extending through the molding compound, and thermally coupling conductive features between the optical component and the electronic component to the heat spreader, or at least one third through via structure extending through the molding compound, and thermally coupling conductive features over the optical component to the heat spreader.

16. The method of claim 15, further comprising:

forming a first waveguide by:

forming a first polymer cladding layer over the optical component, forming a first polymer core layer over the first polymer cladding layer, and forming a second polymer cladding layer over the first polymer core layer; and forming a second waveguide by:

forming a second polymer core layer over the second polymer cladding layer, and forming a third polymer cladding layer over the second polymer core layer, wherein the second waveguide is optically coupled to the optical component through the first waveguide.

17. The method of claim 16, further comprising:

releasably bonding the heat spreader and a die to a carrier;

sequentially depositing and patterning a redistribution structure over the second waveguide, the redistribution structure electrically coupling the die to at least one of the electronic component or the optical component; and detaching the carrier from the heat spreader and the die.

18. The method of claim 16, further comprising:

bonding a die to the heat spreader; and sequentially depositing and patterning a redistribution structure over the second waveguide, the redistribution structure electrically coupling the die to at least one of the electronic component or the optical component.

19. The method of claim 16, further comprising:

releasably bonding the heat spreader and a further heat spreader to a carrier, the further heat spreader spaced from the heat spreader;

bonding a die to the further heat spreader;

sequentially depositing and patterning a redistribution structure over the second waveguide, the redistribution structure electrically coupling the die to at least one of the electronic component or the optical component; and detaching the carrier from the heat spreader and the further heat spreader.

20. A method, comprising:

bonding a plurality of stacked structures, each comprising an electronic component and an optical component, to one or more heat spreaders, wherein the electronic component of each stacked structure of the plurality of stacked structures is bonded to a corresponding heat spreader of the one or more heat spreaders;

forming an array of waveguides over the plurality of stacked structures, wherein the array of waveguides comprises at least one waveguide optically coupling the optical components of adjacent first and second stacked structures among the plurality of stacked structures, and the at least one waveguide extends over and across a spacing between the first and second stacked structures; and performing a dicing operation to obtain an integrated circuit (IC) package comprising:

the first and second stacked structures, at least one corresponding heat spreader bonded to the electronic components of the first and second stacked structures, and the at least one waveguide.

* * * * *